US012355443B2

(12) United States Patent
Pasotti et al.

(10) Patent No.: US 12,355,443 B2
(45) Date of Patent: Jul. 8, 2025

(54) IN-MEMORY COMPUTATION SYSTEM WITH BUILT-IN SUBTRACTION MODE FOR HANDLING MATRIX VECTOR MULTIPLICATION OF SIGNED FEATURE DATA AND SIGNED COMPUTATIONAL WEIGHT DATA

(71) Applicant: STMicroelectronics International N.V., Geneva (CH)

(72) Inventors: Marco Pasotti, Travaco' Siccomario (IT); Riccardo Zurla, Binasco (IT); Marcella Carissimi, Bergamo (IT); Riccardo Vignali, Graffignana (IT); Alessandro Cabrini, Pavia (IT)

(73) Assignee: STMicroelectronics International N.V., Geneva (CH)

( * ) Notice: Subject to any disclaimer, the term of this patent is extended or adjusted under 35 U.S.C. 154(b) by 132 days.

(21) Appl. No.: 18/241,813

(22) Filed: Sep. 1, 2023

(65) Prior Publication Data

US 2025/0080118 A1    Mar. 6, 2025

(51) Int. Cl.
H03K 23/00 (2006.01)
H03K 21/02 (2006.01)
H03K 23/40 (2006.01)

(52) U.S. Cl.
CPC ........... *H03K 21/023* (2013.01); *H03K 23/40* (2013.01)

(58) Field of Classification Search
CPC .... H03K 23/023; H03K 23/40; H03K 23/425; G11C 11/4096; G11C 11/4074; G11C 11/4076; G11C 11/4085; G11C 11/4094
See application file for complete search history.

(56) References Cited

U.S. PATENT DOCUMENTS

| 8,692,176 | B2 | 4/2014 | Kelly et al. |
| 9,768,785 | B2 | 9/2017 | Schultz et al. |
| 10,943,652 | B2* | 3/2021 | Lu ...................... G11C 13/0028 |
| 11,942,144 | B2* | 3/2024 | Pasotti ................ G11C 11/4096 |
| 2020/0327287 | A1* | 10/2020 | Piveteau ................ G06F 17/16 |
| 2021/0366542 | A1* | 11/2021 | Lee .................... G11C 13/0061 |
| 2022/0075600 | A1 | 3/2022 | Hu et al. |
| 2022/0366059 | A1 | 11/2022 | Sadidharan Rajalekshmi et al. |
| 2023/0238055 | A1 | 7/2023 | Pasotti et al. |
| 2024/0153552 | A1* | 5/2024 | Chang ................. G11C 11/4085 |

OTHER PUBLICATIONS

EPO Search Report and Written Opinion for counterpart EP Appl. No. 24193815.8, report dated Jan. 23, 2025, 8 pgs.
Bharti, Pramod Kumar, et al.: "Compute-In-Memory Using 6T SRAM for a Wide Variety of Workloads," 2022 IEEE (ISCAS), May 27, 2022, pp. 2963-2967.

\* cited by examiner

*Primary Examiner* — Tuan T Lam
(74) *Attorney, Agent, or Firm* — Crowe & Dunlevy LLC

(57) ABSTRACT

An in-memory computation circuit includes a memory array with memory cells arranged in a matrix in rows and columns. Groups of memory cells store computational weights for an in-memory compute (IMC) operation that is performed with a first multiply and accumulate (MAC) elaboration to produce a first analog signal and a second MAC elaboration to produce a second analog signal. An analog-to-digital converter circuit operates to: increment a count value in a counter circuit in response to the first analog signal; convert the count value in the counter circuit to a negated count value; and increment the count value in the counter circuit starting from the negated count value in response to the second analog signal.

26 Claims, 9 Drawing Sheets

IN-MEMORY COMPUTATION SYSTEM WITH BUILT-IN SUBTRACTION MODE FOR HANDLING MATRIX VECTOR MULTIPLICATION OF SIGNED FEATURE DATA AND SIGNED COMPUTATIONAL WEIGHT DATA

TECHNICAL FIELD

Embodiments relate to an in-memory computation system and, in particular, to a system supporting in-memory compute operations involving the matrix vector multiplication of signed feature data and signed computational weight data.

BACKGROUND

An in-memory computation (IMC) system stores information in the bit cells of a memory array and performs calculations at the bit cell level. An example of a calculation performed by an IMC system is a multiply and accumulate (MAC) operation using matric vector multiplication (MVM) where an input array of numbers (X values, also referred to as the feature or coefficient data) are multiplied by an array of computational weights (g values) stored in the memory and the products are added together to produce an output array of numbers (Y values).

$$\begin{bmatrix} Y_1 \\ Y_2 \\ \vdots \\ Y_m \end{bmatrix} = \begin{bmatrix} g_{11} & g_{12} & \cdots & g_{1n} \\ g_{21} & g_{22} & \cdots & g_{2n} \\ \vdots & \vdots & \vdots & \vdots \\ g_{m1} & g_{m2} & \cdots & g_{mn} \end{bmatrix} \times \begin{bmatrix} X_1 \\ X_2 \\ \vdots \\ X_n \end{bmatrix}$$

$$\begin{cases} Y_1 = g_{11} \times X_1 + g_{12} \times X_2 + \ldots + g_{1n} \times X_n \\ Y_2 = g_{21} \times X_1 + g_{22} \times X_2 + \ldots + g_{2n} \times X_n \\ \vdots \\ Y_m = g_{m1} \times X_1 + g_{m2} \times X_2 + \ldots + g_{mn} \times X_n \end{cases}$$

By performing these calculations at the bit cell level in the memory, the IMC system does not need to move data back and forth between a memory device and a computing device. Thus, the limitations associated with data transfer bandwidth between devices are obviated and the computation can be performed with lower power consumption.

It is recognized that the data value for the feature or coefficient data $X_n$ of an in-memory compute operation can be signed and also that the data value for the computational weight data $g_{mn}$ of that in-memory compute operation can be signed. In connection with supporting matrix vector multiplication with signed data, each in-memory compute operation may be performed to include a positive elaboration (associated with cases where the signs of the feature or coefficient data $X_n$ and the computational weight data $g_{mn}$ are either both positive or both negative) and a negative elaboration (associated with cases where the signs of the feature or coefficient data $X_n$ and the computational weight data $g_{mn}$ are opposite—one positive and the other negative). The result of the matrix vector multiplication for the in-memory compute operation is then dependent on determining a difference between the result of the positive elaboration and the result of the negative elaboration.

There exists a need in the art to efficiently support performance of signed MAC operations that use both a positive elaboration and a negative elaboration for each in-memory compute operation.

SUMMARY

In an embodiment, an in-memory computation circuit comprises: a memory array including a plurality of memory cells arranged in a matrix with plural rows and plural columns, wherein groups of memory cells store computational weights for an in-memory compute (IMC) operation that is performed with a first multiply and accumulate (MAC) elaboration producing a first analog signal and a second MAC elaboration producing a second analog signal; and an analog-to-digital converter circuit configured to: increment a count value in a counter circuit in response to the first analog signal; convert the count value in the counter circuit to a negated count value; and increment the count value in the counter circuit starting from the negated count value in response to the second analog signal.

The analog-to-digital converter circuit comprises: an integration circuit configured to integrate the first analog signal to produce a first series of pulses, with the counter circuit incrementing the count value in response to each pulse in the first series; and wherein the integration circuit is further configured to integrate the second analog signal to produce a second series of pulses, with the counter circuit incrementing the count value starting from the negated count value in response to each pulse of the second series.

The conversion of the count value in the counter circuit to the negated count value is performed through use of a 2's complement operation on the count value.

The analog-to-digital converter circuit may be implemented with: an integration stage configured to convert a current provided by each of the first and second analog signals into a number of charge packets indicated by pulses; and a counting stage comprising a ripple counter having a counter input configured to receive the pulses.

The counting stage includes a plurality of flip-flops and multiplexing circuitry. The multiplexing circuitry is configured, in response to a first logic state of a control signal, to connect clock inputs of the plurality of flip-flops to form the ripple counter. The multiplexing circuitry is further configured, in response to a second logic state of the control signal, to apply an inverting pulse signal to the clock inputs of the plurality of flip-flops to cause a logical inversion of each bit of the count value stored by the plurality of flip-flops during a logic inversion portion of a 2's complement operation for converting the count value in the counter circuit to the negated count value. A control circuit generates the control signal and further applies a single pulse to the counter input of the counting stage during an add one portion of the 2's complement operation for converting the count value in the counter circuit to the negated count value.

In an embodiment, a method for performing an in-memory compute (IMC) operation comprises: performing a first multiply and accumulate (MAC) elaboration of the IMC operation to produce a first analog signal; incrementing a count value in a counter circuit in response to the first analog signal; converting the count value in the counter circuit to a negated count value; performing a second MAC elaboration of the IMC operation to produce a second analog signal; and incrementing the count value in the counter circuit starting from the negated count value in response to the second analog signal.

Integrating the first analog signal produces a first series of pulses, with incrementing comprising incrementing the count value in the counter circuit in response to each pulse in the first stream. Integrating the second analog signal produces a second series of pulses, with incrementing comprising incrementing the count value in the counter circuit starting from the negated count value in response to each pulse of the second series.

The conversion of the count value to the negated count value is performed through use of a 2's complement operation on the count value.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
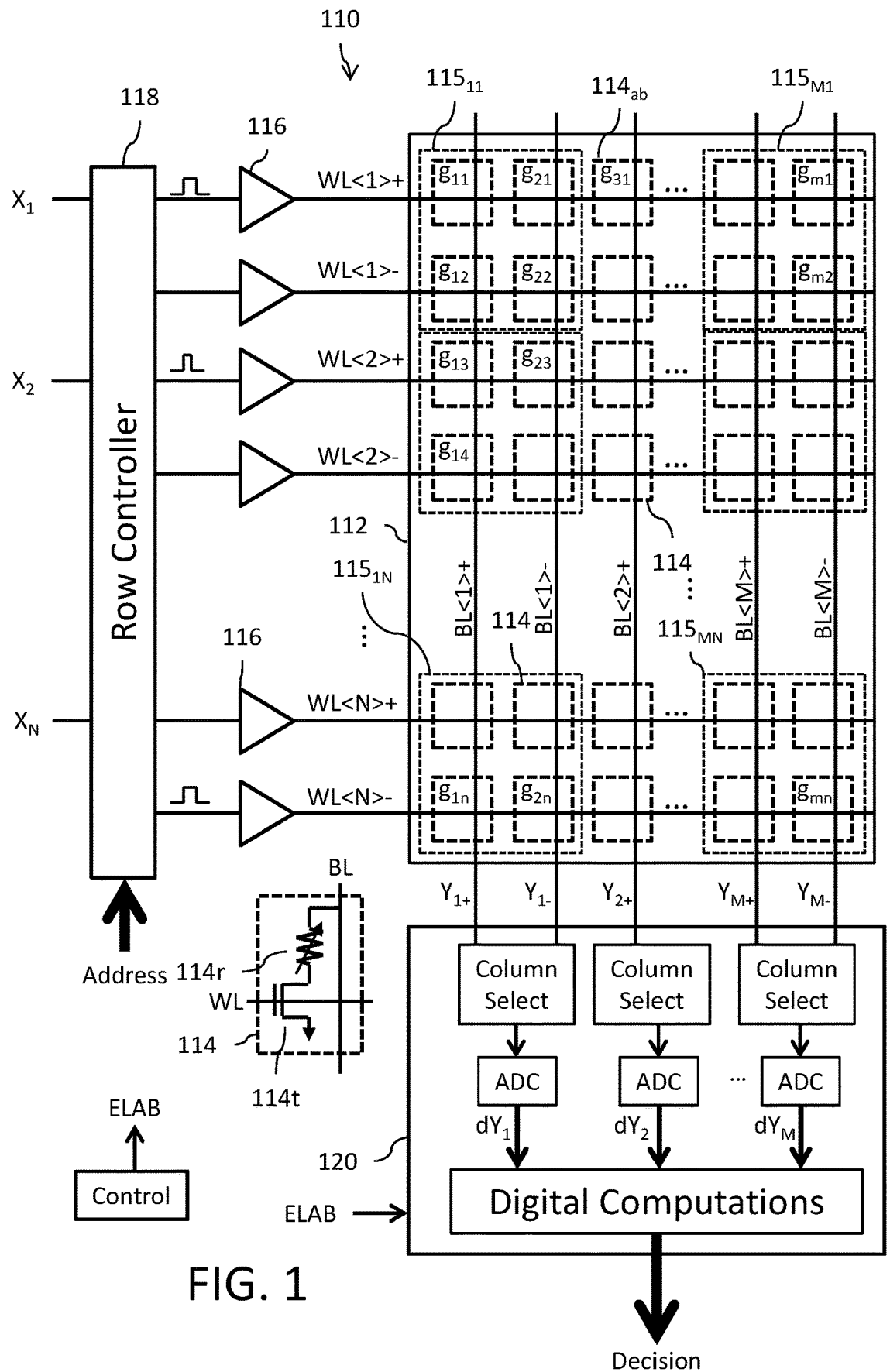
FIG. 1 is a schematic diagram of an embodiment for an in-memory computation circuit.

Reference is now made to FIG. 1 which shows a schematic diagram of an in-memory computation circuit 110. The circuit 110 utilizes a memory array 112 formed by a plurality of memory cells $114_{ab}$ arranged in a matrix format having m columns and n rows, where a is an integer from 1 to m and b is an integer from 1 to n. The array 112 is arranged to include groups $115_{11}$ to $115_{MN}$ of memory cells 114, wherein each group $115_{AB}$ includes four memory cells arranged in a 2×2 matrix across two rows and two columns of the array 112, where A is an integer from 1 to M and B is an integer from 1 to N. With this arrangement, there are N rows of groups $115_{AB}$ and M columns of groups $115_{AB}$ (where N=n/2 and M=m/2). Although the memory cells 114 of a group $115_{AB}$ are shown to be located in adjacent ones of the m columns of the array 112, it will be understood that this is by way of example only to ease the illustration and that in a preferred implementation the cells will most likely be separated from each other using a column multiplexing format as is well known to those skilled in the art.

Each group $115_{AB}$ of memory cells 114 stores a signed computational weight (also referred to as kernel data) for an in-memory compute operation. Each memory cell 114 can be programmed to store a bit of data $g_{ab}$, with the four bits of data $g_{ab}$ stored by the corresponding four memory cells of each group $115_{AB}$ forming the signed computational weight of that group $115_{AB}$. Each bit of data has either a logic "1" or a logic "0" value which is represented, for example, by a programmable conductance in the memory cell 114. A signed computational weight of "+1" for a given group $115_{AB}$ is represented by programming logic "1" in the memory cells 114 of the main diagonal of the 2×2 matrix (for example, see $g_{11}=1$ and $g_{22}=1$ of group $115_{11}$), and programming logic "0" in the memory cells 114 of the antidiagonal of the 2×2 matrix (for example, see $g_{12}=0$ and $g_{21}=0$ of group $115_{11}$) as illustrated by the matrix:

$$\begin{bmatrix} 1 & 0 \\ 0 & 1 \end{bmatrix},$$

this being referred to in the art as the identity matrix. A signed computational weight of "−1" for a given group $115_{AB}$ is represented by programming logic "0" in the memory cells 114 of the main diagonal of the 2×2 matrix (for example, see $g_{11}=0$ and $g_{22}=0$) and programming logic "1" in the memory cells 114 of the antidiagonal of the 2×2 matrix (for example, see $g_{12}=1$ and $g_{21}=1$ of group $115_{11}$) as illustrated by the matrix:

$$\begin{bmatrix} 0 & 1 \\ 1 & 0 \end{bmatrix},$$

this being referred to in the art as the exchange (or backward identity) matrix. A signed computational weight of "0" for a given group $115_{AB}$ is represented by programming logic "0" in all memory cells of the 2×2 matrix (for example, see $g_{11}=0$, $g_{22}=0$, $g_{12}=0$ and $g_{21}=0$ of group $115_{11}$) as illustrated by the matrix:

$$\begin{bmatrix} 0 & 0 \\ 0 & 0 \end{bmatrix},$$

this being referred to in the art as the zero matrix.

In an embodiment of the memory array 112, each memory cell 114 comprises a phase change memory (PCM) cell formed by a select circuit (MOSFET transistor, BJT transistor, diode device, etc.) 114t operating as a switching element and a variable resistive element 114r providing a programmable conductance. In the case of a MOSFET transistor for the select circuit 114t, the control node (gate) of the MOSFET transistor is connected to the word line WL. The source-drain path of the MOSFET transistor is connected in series with the variable resistive element 114r between the bit line BL and a reference node (for example, a source line or ground). More specifically, a drain of the MOSFET transistor is connected to a first terminal of the variable resistive element 114r, the source of the MOSFET transistor is connected to the reference node, and the second terminal of the variable resistive element 114r is connected to the bit line BL.

As is well known to those skilled in the art, a PCM-type memory cell 114 is configured to store data using a phase change material (such as a chalcogenide) that is capable of stably transitioning between amorphous and crystalline phases according to an amount of heat transferred thereto. The amorphous and crystalline phases exhibit two or more distinct resistances (corresponding to the variable resistive element 114r), in other words two or more distinct conductances, which are used to distinguish two or more distinct logic states programmable into the memory cell. The amorphous phase exhibits a relatively higher resistance (i.e., a lower conductance) and thus the current sunk from the bit line BL by the memory cell programmed in this state when selected by assertion of the word line signal at the gate of the select circuit 114t is relatively smaller. Conversely, the crystalline phase exhibits a relatively lower resistance (i.e., a higher conductance) and thus the current sunk from the bit line BL by the memory cell programmed in this state when selected by assertion of the word line signal at the gate of the select circuit 114t is relatively larger.

In an embodiment for a specific, but non-limiting, example for two distinct logic states: the amorphous phase may represent programming of the memory cell to logic "0" (or reset state) for the associated coefficient weight and the crystalline phase may represent programming of the memory cell to logic "1" (or set state) for the associated coefficient weight. Although binary (i.e., two distinct logic states) data is described in detail herein, it will be understood that the memory cell 114 may instead support storage of m-ary (i.e., three or more distinct logic states) data in some applications.

It will be understood that other memory cell types could instead be used for the array 112. For example, magnetoresistive random access memory (MRAM) cells or resistive random access memory (RRAM) cells could be used. The memory cell may alternatively comprise a static random access memory (SRAM) cell.

Each memory cell 114 includes a word line WL and a bit line BL. The memory cells 114 in a common row of the matrix are connected to each other through a common word line WL. The groups $115_{AB}$ of memory cells 114 in a common row of groups $115_{AB}$ are connected to each other through a positive word line WL<B>+ and a negative word line WL<B>− (which form a word line pair for the common row of groups $115_{AB}$). More specifically, the positive word line WL<B>+ is connected to the upper two memory cells in the 2×2 matrix for the group (for example, see WL<1>+ for $g_{11}$ and $g_{21}$ of group $115_{11}$), while the negative word line WL<B>− is connected to the lower two memory cells in the 2×2 matrix for the group (for example, see WL<1>− for $g_{12}$ and $g_{22}$ of group $115_{11}$).

The memory cells 114 in a common column of the matrix are connected to each other through a common bit line BL. The groups $115_{AB}$ of memory cells 114 in a common column of groups $115_{AB}$ are connected to each other through a positive elaboration bit line BL<A>+ and a negative elaboration bit line BL<A>− (which form a bit line pair for the common column of groups $115_{AB}$). More specifically, the positive elaboration bit line BL<A>+ is connected to the left two memory cells in the 2×2 matrix for the group (for example, see BL<1>+ for $g_{11}$ and $g_{12}$ of group $115_{11}$), while the negative elaboration bit line BL<A>− is connected to the right two memory cells in the 2×2 matrix for the group (for example, see BL<1>− for $g_{21}$ and $g_{22}$ of group $115_{11}$).

Each word line WL is driven by a word line driver circuit 116 with a pulsed word line signal generated by a row controller circuit 118. The word line driver circuit 116 may be implemented as a CMOS driver or buffer circuit (for example, formed by the series connection of two CMOS logic inverters).

The row controller circuit 118 receives the signed feature or coefficient data $X_1$ to $X_N$ for the in-memory compute operation. The row controller circuit 118 also receives an address signal (Address) for the in-memory compute operation and, under the control of a control circuit, in response thereto selectively loads the signed feature or coefficient data $X_1$ to $X_N$ for association with the rows of groups $115_{AB}$ of memory cells 114 which are to be simultaneously selected in parallel during each of a positive elaboration and a negative elaboration of the analog in-memory compute operation. During the simultaneous access for each of the positive and negative elaborations, only one word line of each word line pair (WL<B>+ or WL<B>−) is actuated with a pulsed word line signal. The actuated one word line of the word line pair in each elaboration is selected based on the logic state of the sign bit of the feature or coefficient data $X_B$. For example, if the sign bit is logic 0, indicative of a positive coefficient data value, then the positive word line WL<B>+ is asserted during the elaboration. Conversely, if the sign bit is logic 1, indicative of a negative coefficient data value, then the negative word line WL<B>− is asserted during the elaboration. The row controller circuit 118 still further controls, for each corresponding actuated word line, the width (i.e., the on time $T_{ON}$) of the generated pulsed word line signal. This functionality is a form of a pulse width modulation (PWM) control for the applied word line signals dependent on the digital value of the received signed feature or coefficient data $X_B$.

In an embodiment, the signed feature or coefficient data $X_B$ is provided in multi-bit signed binary format, with a 4-bit example as set forth in the following table:

| Decimal | Binary | Decimal | Binary |
|---|---|---|---|
| 0 | 0000 | 0 | 1000 |
| +1 | 0001 | −1 | 1001 |
| +2 | 0010 | −2 | 1010 |
| +3 | 0011 | −3 | 1011 |
| +4 | 0100 | −4 | 1100 |
| +5 | 0101 | −5 | 1101 |
| +6 | 0110 | −6 | 1110 |
| +7 | 0111 | −7 | 1111 |

The use of a 4-bit format for the signed feature or coefficient data $X_B$ is just an example, it being understood that the signed feature or coefficient data $X_B$ can use any selected number of bits depending on the computation application.

It will be noted that the most significant bit of the signed binary feature or coefficient data $X_B$ provides the sign bit (logic 0 is positive, logic 1 is negative) used to control selection of the positive (WL<B>+) or negative (WL<B>−) word line of the word line pair during both of the positive and negative elaborations, while the remaining less significant bits provide the value specifying the pulse width duration for the word line signal applied to that selected word line of the word line pair for each of the positive and negative elaborations.

FIG. 1 illustrates, by way of example only, the simultaneous selection of all rows of groups $115_{AB}$ of memory cells 114 in response to the non-zero feature or coefficient data, and further illustrates, by way of example only, an elaboration (positive or negative) of the in-memory compute operation including the simultaneous actuation of certain positive word lines (WL<1>+ and WL<2>+, for example) corresponding to positively signed feature or coefficient data ($X_1$ and $X_2$, for example) with pulsed word line signals having pulse widths set by the digital value of the corresponding coefficient data, along with the simultaneous actuation of certain negative word lines (WL<N>−, for example) corresponding to negatively signed feature or coefficient data ($X_N$, for example) with pulsed word line signals having pulse widths set by the digital value of the corresponding coefficient data. Again, it will be noted that a maximum of only one word line of each word line pair is actuated. It will, of course, be understood that the elaboration for the analog in-memory compute operation may instead utilize a simultaneous selection of fewer than all rows of groups $115_{AB}$ of memory cells 114 (through either Address signal selection or through a zero value for the coefficient data $X_B$).

The analog signal $Y_A$ developed on the positive/negative bit line BL corresponding to the positive/negative elaboration is dependent on the logic state of the bit of data $g_{ab}$ for the signed computational weight stored in the memory cells 114 of the column and the widths of the pulsed word line signals applied to the word lines WL for those memory cells 114. More specifically, it will be understood that each memory cell 114 contributes a bit line BL discharge current during the elaboration that is proportional to $X_B \times g_{ab}$. So, in the example shown in FIG. 1 where the word line signals are simultaneously applied to the word lines WL<1>+, WL<2>+, . . . , WL<N>−, the analog signal $Y_{1+}$ developed on the positive elaboration bit line BL<1>+ during the positive elaboration is proportional to the sum of discharge currents due to $X_1 \times g_{11}$, $0 \times g_{12}$, $X_2 \times g_{13}$, $0 \times g_{14}$, . . . , $0 \times g_{1n-1}$ and $X_N \times g_{1n}$. Likewise, the analog signal $Y_{1-}$ developed on the negative elaboration bit line BL<1>− during the negative elaboration is proportional to the sum of discharge currents due to $X_1 \times g_{21}$, $0 \times g_{22}$, $X_2 \times g_{23}$, $0 \times g_{24}$, . . . , $0 \times g_{2n-1}$ and $X_N \times g_{2n}$. The overall result of the in-memory compute operation is a function of the difference between the analog signals $Y_A$ sensed on the positive and negative elaboration bit lines BL<1>+, BL<A>− for the positive and negative elaborations, respectively.

Let's assume now, for example only, some specific signed computational weights for the groups $115_{AB}$ of memory cells 114 in this column of groups. Group $115_{11}$ is programmed with a weight of −1 which is represented by the exchange matrix $$\begin{bmatrix} 0 & 1 \\ 1 & 0 \end{bmatrix}.$$

Group $115_{12}$ is programmed with a weight of 0 which is represented by the zero matrix $$\begin{bmatrix} 0 & 0 \\ 0 & 0 \end{bmatrix}.$$

Group $115_{1N}$ is programmed with a weight of +1 which is represented by the identity matrix $$\begin{bmatrix} 1 & 0 \\ 0 & 1 \end{bmatrix}.$$

So, for this example, the analog signal $Y_{1+}$ developed on the positive elaboration bit line BL<1>+ during the positive elaboration of the in-memory compute operation is proportional to the sum of discharge currents due to $X_1 \times 0$, $0 \times 1$, $X_2 \times 0$, $0 \times 0$, . . . , $0 \times 1$ and $X_N \times 0$; which would result in zero discharge currents on the positive elaboration bit line BL<1>+. The analog signal $Y_{1-}$ developed on the negative elaboration bit line BL<1>− during the negative elaboration of the in-memory compute operation is proportional to the sum of discharge currents due to $X_1 \times 1$, $0 \times 0$, $X_2 \times 0$, $0 \times 0$, . . . , $0 \times 0$ and $X_N \times 1$; which would result in a sum of discharge currents due to $X_1 \times 1$, . . . , and $X_N \times 1$ on the negative elaboration bit line BL<1>−.

A column processing circuit 120 includes a column selection circuit coupled to the positive elaboration bit line BL<A>+ and negative elaboration bit line BL<A>− of the corresponding bit line pair. The column selection circuit is controlled by the logic state of an elaboration control signal ELAB generated by a control circuit and functions as a multiplexer to selectively couple the negative elaboration bit line BL<A>− to the ADC circuitry during the negative elaboration of the in-memory compute operation (ELAB=0) and selectively couple the positive elaboration bit line BL<A>+ to the ADC circuitry during the positive elaboration of the in-memory compute operation (ELAB=1). The ADC circuitry receives a bit line current indicative of the analog signal $Y_{A-}$ developed on the negative elaboration bit line BL<A>− during the negative elaboration (ELAB=0), converts that bit line current through an integration process to generate a first series of pulses using an integration circuit, and then counts the number of pulses in the first series of pulses using a counter circuit. The counted number of pulses in the first series of pulses, and hence the current count value in the counter circuit at this point, is a digital value converted from the bit line current of the analog signal $Y_{A-}$. The ADC circuitry then performs a 2's complement operation on the count value in the counter circuit to produce a negated count value. The ADC circuitry then receives a bit line current indicative of the analog signal $Y_{A+}$ developed on the positive elaboration bit line BL<A>+ during the positive elaboration (ELAB=1), converts that bit line current through the integration process to generate a second series of pulses using the integration circuit, and then counts (starting from the negated count value) the number of pulses in the second series of pulses using the counter circuit. The counted number of pulses in the second series of pulses is a digital value converted from the bit line current of the analog signal $Y_{A+}$. The count value in the counter circuit at this point is the digital signal $dY_A$ which has a digital value equal to the difference between the digital value converted from the analog signal $Y_{A+}$ and digital value converted from the analog signal $Y_{A-}$ (in other words, $dY_A = -(dY_{A-}) + dY_{A+} = dY_{A+} - dY_{A-}$, where "d" signifies the digital value of the analog signal $Y_{A-/+}$ obtained through the integration and counting operations of the ADC circuitry).

Let's consider a specific example to illustrate the operation performed by the column processing circuit 120. The negative elaboration bit line BL<A>− is connected to the ADC circuitry during the negative elaboration of the in-memory compute operation (ELAB=0) and the bit line current iBL<A> on the negative elaboration bit line BL<A>− is integrated to generate a first series of pulses. The value in the counter circuit is reset and then incremented by one in response to each of the 350 pulses in the first series of pulses and thus the binary value in the counter circuit is (0b 01 0101 1110=350). Next, the ADC circuitry performs a 2's complement operation on the count value in the counter circuit to produce a negated count value. This 2's complement operation involves: a) inverting the logic state of each bit of the value in the counter circuit to produce (0b 10 1010 0001=−351); and then b) adding one to produce the negated count value in the counter circuit as (0b 10 1010 0010=−350). The positive elaboration bit line BL<A>+ is then connected to the ADC circuitry during the positive elaboration of the in-memory compute operation (ELAB=1) and the bit line current iBL<A> on the positive elaboration bit line BL<A>+ is integrated to generate a second series of pulses. The negated value in the counter circuit is incremented by one in response to each of the 200 pulses in the second series of pulses and thus the binary value in the counter circuit is (0b 11 0110 1010=−150).

The column processing circuit 120 further includes digital signal processing circuitry for storing the resulting digital signals $dY_A$ for the in-memory compute operation and performing digital computations and calculations on the digital signals $dY_A$ to generate a decision output for the in-memory compute operation.

Although FIG. 1 illustrates that one analog-to-digital converter (ADC) is provided for each bit line pair, it will be understood that ADC resources in the column processing circuit 120 could instead be shared by multiple bit line pairs using time division multiplexing.

Although not explicitly shown in FIG. 1, it will be understood that the circuit 110 further includes conventional row decode, column decode, and read-write circuits known to those skilled in the art for use in connection with writing bits of data (for example, the computational weight data) to, and reading bits of data from, the memory cells 114 of the memory array 112. This operation is referred to as a conventional memory access mode and is distinguished from the analog in-memory compute operation discussed above.

Figure 2:
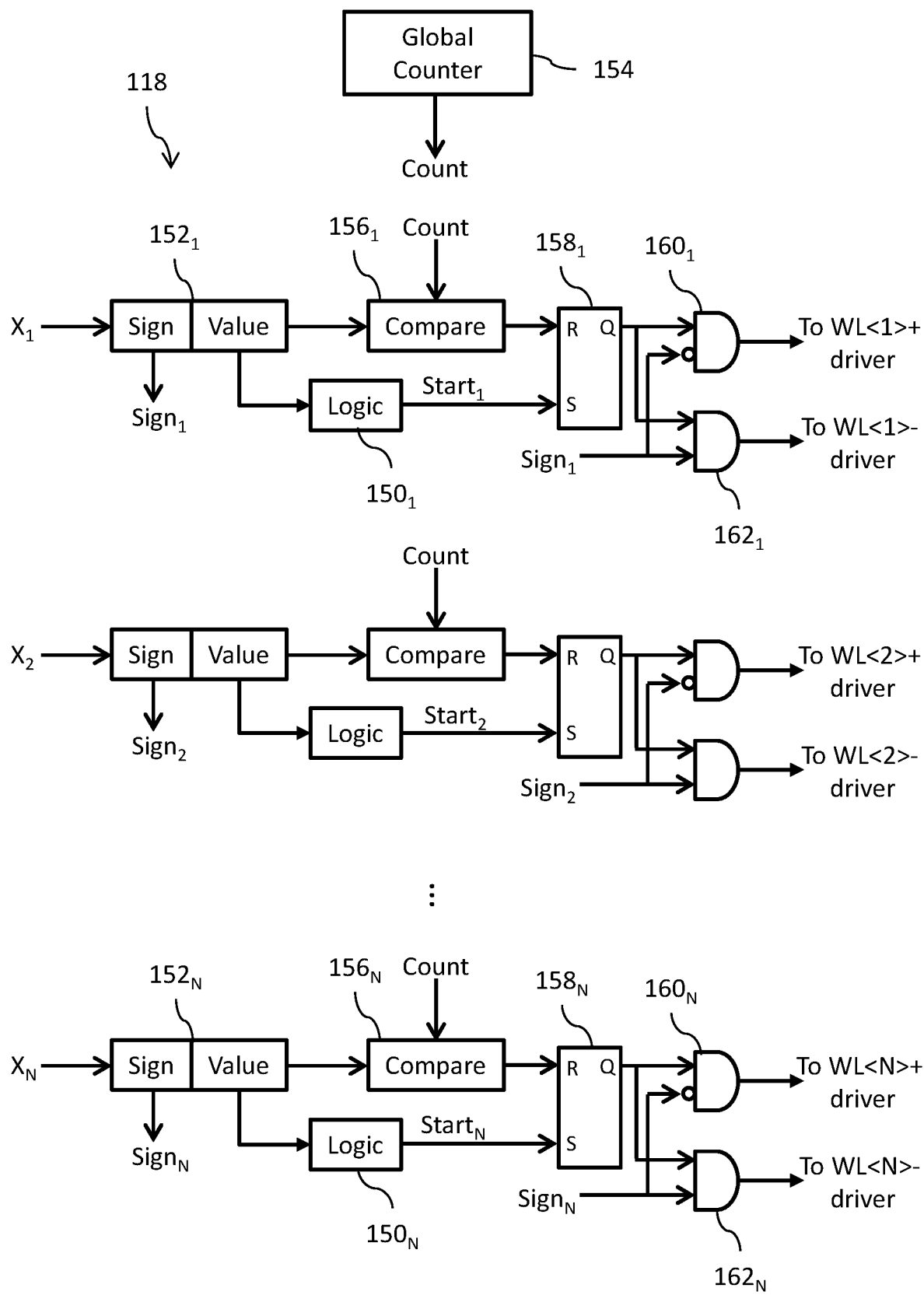
FIG. 2 shows a circuit diagram for a row controller circuit used by the in-memory computation circuit of FIG. 1.

Reference is now made to FIG. 2 which shows a circuit diagram for the row controller 118. A latch circuit 152$_B$ is provided for each row of groups 115$_{AB}$ of memory cells 114 to latch, for example in response to a decoded Address value, the corresponding sign and value of the signed digital value of the coefficient data $X_B$. A logic circuit 150$_B$ is provided for each row of groups 115$_{AB}$ of memory cells 114. The logic circuits 150$_1$ to 150$_N$ assert a start signal (Start$_B$), for example in response to a global start signal generated by the control circuit, at a beginning of each of the positive and negative elaborations of the in-memory compute operation. The generation of this start signal may, for example, be dependent on the corresponding signed digital value of the coefficient data $X_B$ having a non-zero value for the analog in-memory compute operation. A global counter circuit 154 increments a count value (Count) starting from a zero reset at the beginning of each (positive/negative) elaboration for the in-memory compute operation, wherein the elaboration ends when the Count reaches a maximum value. A compare circuit 156$_B$ for each row of groups 115$_{AB}$ of memory cells 114 is coupled to the latch circuit 152$_B$ and compares the count value Count to the latched digital value of the coefficient data $X_B$. The output of the compare circuit 156$_B$ is asserted when the count value Count meets or exceeds the latched digital value. A set-reset latch circuit 158$_B$ has a set(S) input coupled to receive the Starts signal output from the logic circuit 150$_B$ and a reset (R) input coupled to receive the output of the compare circuit 156$_B$. A combinational logic circuit 160$_B$ logically combines the output (Q) of the set-reset latch circuit 158$_B$ and the logical inverse of the sign bit Sign$_B$ from the latch circuit 152$_B$ to generate the pulsed word line signal for application to the driver circuit 116 of the positive word line WL<B>+. A combinational logic circuit 162$_B$ logically combines the output (Q) of the set-reset latch circuit 158$_B$ and the sign bit Sign$_B$ from the latch circuit 152$_B$ to generate the pulsed word line signal for application to the driver circuit 116 of the negative word line WL<B>−. In an embodiment, the combinational logic circuits 160$_B$ and 162$_B$ are logic AND gates.

Operation of the circuitry within the row controller 118 is as follows: At the beginning of the in-memory compute operation, the address signal Address is decoded to control selective loading of the digital values of the coefficient data $X_1$ to $X_N$ for latching by the latch circuits 152$_1$ to 152$_N$, and the global counter 154 is reset. If the digital value of the coefficient data is non-zero, the logic circuit 150$_B$ indicates selection of the row of groups 115$_{AB}$ of memory cells 114, the start signal Starts output of the logic circuit 150$_B$ is asserted logic high at the beginning of each of the positive and negative elaborations, and the set-reset latch circuit 158$_B$ is set with its output Q logic high. If the sign bit Sign$_B$ is logic 0, indicating that the digital value of the coefficient data $X_B$ is positive, both inputs of the AND gate 160$_B$ are logic high and the output of the AND gate 160$_B$ transitions to logic high to provide the leading edge of the word line signal pulse on the positive word line WL<B>+. Conversely, if the sign bit Sign$_B$ is logic 1, indicating that the digital value of the coefficient data $X_B$ is negative, both inputs of the AND gate 162$_B$ are logic high and the output of the AND gate 162$_B$ transitions to logic high to provide the leading edge of the word line signal pulse on the negative word line WL<B>−. The global counter 154 then begins incrementing the Count value. When the incrementing Count value meets or exceeds the digital value of the coefficient data $X_B$ latched by the latch circuit 152$_B$, the output of the compare circuit 156$_B$ is asserted logic high, and the set-reset latch circuit 158$_B$ is reset with its output Q logic low. This logic low output is applied to both of the AND gates 160$_B$ and 162$_B$, and whichever output of those AND gates is logic high (corresponding to assertion of the word line signal pulse) will transition to logic low to provide the trailing edge of the word line signal pulse. The pulse width (i.e., the on time $T_{ON}$) of the generated pulsed word line signal is thus dependent on the amount of time needed during the elaboration of the in-memory compute operation for the incrementing Count value to reach the digital value of the coefficient data $X_B$. When the Count reaches its maximum value, the given elaboration ends.

Figure 3:
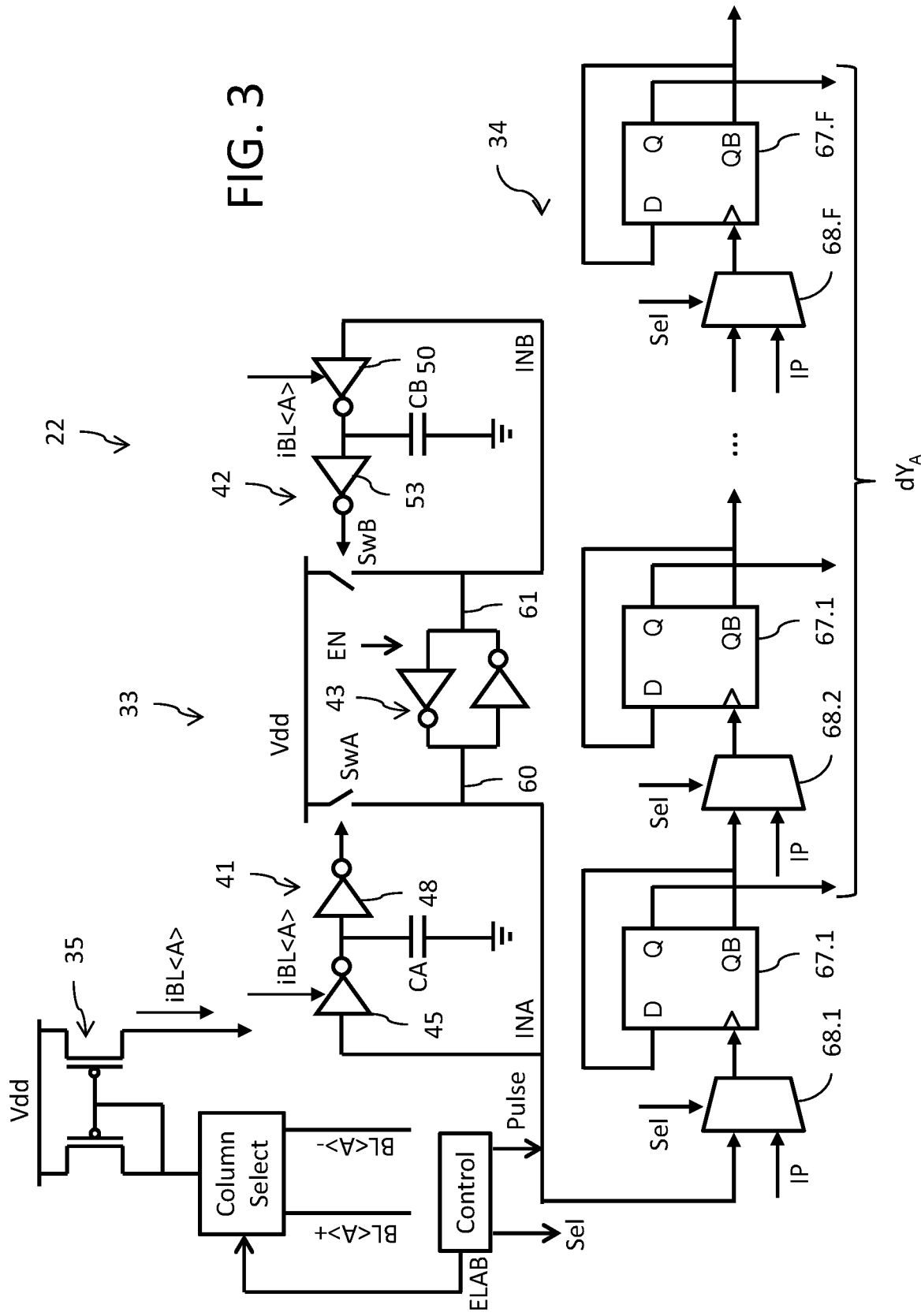
FIG. 3 shows a circuit diagram for an analog-to-digital converter circuit used by the in-memory computation circuit of FIG. 1.

Reference is now made to FIG. 3 which shows a circuit diagram for an instance of the ADC circuit (referred to herein as a digital detector 22 circuit). Each ADC circuit digital detector 22 is coupled to a respective bit line pair BL<A>+ and BL<A>− through a column selection circuit controlled by the elaboration signal ELAB. A current iBL<A> flowing through the selected bit line BL<A>+ and BL<A>− is mirrored by a current mirror circuit 35 of the digital detector 22.

Each digital detector 22 for a bit line pair BL<A>+ and BL<A>− comprises an integration stage 33 and a counter stage 34.

The integration stage 33 comprises a first integration circuit 41, a second integration circuit 42, and a switching circuit 43 coupled between the first and the second integration circuits 41, 42.

The first and second integration circuits 41, 42 are coupled to receive the mirrored bit line current iBL<A> as a bias current.

The first integration circuit 41 comprises a first inverter 45, a capacitor CA coupled at the output of the first inverter 45, and a second inverter 48 having an input coupled to the output of the first inverter 45. The first inverter 45 has a supply node (for example, the source node of the PMOS transistor within the inverter 45) coupled, and biased by, the mirrored bit line current iBL<A> and an input configured to receive a first control signal INA.

The capacitor CA has a first terminal coupled to the output of the first inverter 45 and a second terminal coupled to a reference potential node, for example ground.

The output of the first inverter 45 is at a first integration voltage that drops across the capacitor CA.

The second inverter 48 has a first sampling threshold, hereinafter referred to as first threshold voltage Vth1, and has an input coupled to receive the first integration voltage across capacitor CA. The output of the second inverter 48 provides a switch control signal to control actuation of a first switch SwA as a function of the first threshold voltage Vth1 and the first integration voltage.

The switch control signal for first switch SwA is a logic signal having a high logic value when the first integration voltage is smaller than the first threshold voltage Vth1, and a low logic value when the first integration voltage is higher than the first threshold voltage Vth1.

The second integration circuit 42 comprises a first inverter 50, a capacitor CB coupled at the output of the first inverter 50, and a second inverter 53 having an input coupled to the output of the first inverter 50. The first inverter 50 has a supply node (for example, the source node of the PMOS transistor within the inverter 50) coupled, and biased by, the mirrored bit line current iBL<A> and input configured to receive a second control signal INB.

The capacitor CB has a first terminal coupled to the output of the first inverter 50 and a second terminal coupled to a reference potential node, for example ground.

The output of the first inverter 50 is at a second integration voltage that drops across the capacitor CB.

The second inverter 53 has a second sampling threshold, hereinafter referred to as second threshold voltage Vth2, and has an input coupled to receive the second integration voltage across capacitor CB. The output of the second inverter 53 provides a switch control signal to control actuation of a second switch SwB as a function of the second threshold voltage Vth2 and the second integration voltage.

The switch control signal for second switch SwB is a logic signal having a high logic value when the second integration voltage is smaller than the second threshold voltage Vth2, and a low logic value when the second integration voltage is higher than the second threshold voltage Vth2.

In this embodiment, the first threshold Vth1 is preferably equal to the second threshold Vth2; however, the first threshold Vth1 may be different to the second threshold Vth2, depending on the specific application.

The switching circuit 43 comprises a latch formed by two inverters arranged in a ring (or cross-coupled) configuration. The switching circuit 43 further comprises the first switch SwA which is controlled by the first switch signal and the second switch SwB which is controlled by the second switch signal.

The latch of the switching circuit 43 has a first node 60 coupled to the input of one of the two inverters and the output of the other of two inverters, and a second node 61 coupled to the output of the one of the two inverters and the input of the other of the two inverters.

The first node 60 provides the first control signal INA. The second node 61 provides the second control signal INB.

The switched circuit path for the first switch SwA is coupled between the first node 60 and a node at a supply voltage Vdd. The switched circuit path for the second switch SwB is coupled between the second node 61 and the node at the voltage Vdd.

The supply voltages Vdd for the current mirror circuit 35 and the switching circuit 43 may be equal or may be different.

The switching circuit 43 further receives an enable signal EN, which controls the activation of the switching circuit 43. For example, the enable signal EN may be used to keep the switching circuit 43 in an off state when not in use, thereby allowing to optimize power consumption. In addition, the enable signal EN may be used to set each of the nodes 60 and 61 of the switching circuit 43 in a defined logic state, for example at start-up.

The charge counter stage 34 may have an input coupled to receive either the first control signal INA or the second control signal INB. FIG. 3 shows an implementation where the first control signal INA is applied as the input. At its core, the charge counter stage 34 is a ripple counter circuit formed by a plurality of D flip-flops 67. The first D flip-flop 67.1 has a clock input coupled to receive the first control signal INA. The Q output of the first D flip-flop 67.1 provides the first bit (i.e., the least significant bit) of the output digital signal $Y_A$. The QB output of the first D flip-flop 67.1 is connected in feedback to the D input of the first D flip-flop 67.1. The second D flip-flop 67.2 has a clock input coupled to receive the signal from the QB output of the first D flip-flop 67.1. The Q output of the second D flip-flop 67.2 provides the second bit (i.e., the next more significant bit) of the output digital signal $Y_A$. The QB output of the second D flip-flop 67.2 is connected in feedback to the D input of the second D flip-flop 67.2. This connection scheme continues for the remaining D flip-flops 67 of the ripple counter circuit. Thus, the last D flip-flop 67.F has a clock input coupled to receive the signal from the QB output of the next to last D flip-flop 67.F-1 The Q output of the last D flip-flop 67.F provides the last bit (i.e., the most significant bit) of the output digital signal $Y_A$. The QB output of the last D flip-flop 67.F is connected in feedback to the D input of the last D flip-flop 67.F.

The first control signal INA comprises a series of pulses generated at a rate which is dependent on the integration of the bit line current iBL<A> from the selected one of the bit lines during the elaboration. The ripple counter circuit of the charge counter stage 34 functions to count the number of pulses in the first control signal INA. The counted number of pulses in the series of pulses provided by the first control signal INA is a digital value converted from the bit line current iBL<A> of the analog signal $Y_A$.

The ripple counter circuit includes additional circuitry to support performance of the 2's complement operation on the count value in the counter circuit to produce a negated count value after completion of the negative elaboration. As known to those skilled in the art, the 2's complement operation is effectuated on a multi-bit binary data value by first inverting the logic state of each bit and then adding (incrementing by) one. The signal applied to the clock input of each D flip-flop 67 is selected by a multiplexer circuit 68 when performing the 2's complement operation to instead be an inverse pulse (IP) when a select signal Sel generated by the control circuit is asserted in a first logic state. This will effectuate the inverting of the logic state of each bit of the multi-bit binary data value stored by the D flip-flops 67.1, . . . , 67.F part of the 2's complement operation. The control circuit then sets the select signal Sel to a second logic state for returning the charge counter stage 34 back to the ripple counter configuration. In response thereto, the multiplexer circuit 68.1 will connect the input of the ripple counter circuit to the clock input of the first D flip-flop 67.1, pass and the remaining multiplexer circuits 68.2, . . . , 68.F will connect the clock input of each D flip-flop 67.2, . . . , 67.F to the QB output of the preceding D flip-flop 67.1, . . . , 67.F-1. The control circuit will then further apply a single pulse (Pulse) at the input of the ripple counter circuit. This will effectuate the add (increment by) one part of the 2's complement operation.

Figure 4:
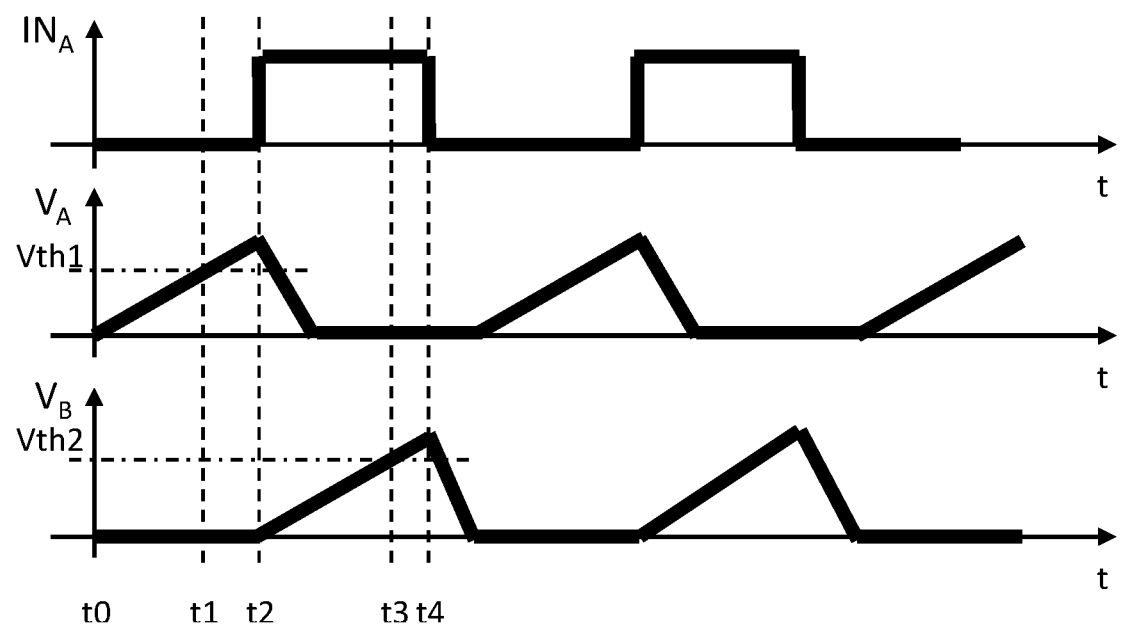
FIG. 4 is a timing diagram illustrating operation of the analog-to-digital converter circuit of FIG. 3.

FIG. 4 shows an example of the time behavior of the first control signal INA, the first integration voltage ($V_A$) on capacitor CA and the second integration voltage ($V_B$) on capacitor CB of the digital detector 22 of FIG. 3.

For the time period t0<t<t1, the first integration voltage $V_A$ is below the first threshold Vth1. Accordingly, the output of the second inverter 48 of the first integration circuit 41 is logic high. Therefore, the first switch signal will control the first switch SwA to be open. The first control signal INA this has a logic low value.

It follows that, with respect to the first inverter 45 of the first integration circuit 41, for the time period t0<t<t1, the PMOS transistor of the first inverter 45 is turned on and the mirrored bit line current iBL<A> flows, from the current mirror 35, through the first inverter 45 of the first integration circuit 41 to charge the capacitor CA.

At the same time, for the time period t0<t<t1, the second control signal INB has a logic high value. Therefore, with respect to the first inverter 50 of the second integration circuit 42, for the time period t0<t<t1, the output of the first inverter 50 is logic low. Accordingly, the mirrored bit line current iBL<A> does not flow, from the current mirror 35, through the first inverter 50 of the second integration circuit 42.

In response to the mirrored bit line current iBL<A> flowing through the PMOS transistor of the first inverter 45, the first integration voltage $V_A$ across capacitor Ca increases during the time period t0<t<t1.

The first integration voltage $V_A$ increases linearly during time period t0<t<t1; however, the behavior of the first integration voltage $V_A$ depends on the specific behavior of the bit line current iBL<A> during the time period t0<t<t1.

When the first integration voltage $V_A$ becomes equal to the first threshold voltage Vth1, the output of the second inverter 48 changes to logic low. The switch SwA is then actuated and the first control signal INA assumes the logic high value at time t2.

The time delay between time t1 and time t2 may correspond, for example, to the propagation delay of the second inverter 48 of the first integration circuit 41 and/or the switching time of the first switch SwA.

For the time period t1<t<t2, the mirrored bit line current iBL<A> continues to charge the capacitor CA through the inverter 45. Thus, the first integration voltage $V_A$ will continue to increase up to a maximum value at time t2.

At time t2, when the first control signal INA assumes the high value, the second control signal INB (here not shown) assumes the low value (note: the inverter 56 of the switching circuit 43 receives the first control signal INA at input).

While the first control signal INA has the high value, the output of the first inverter 45 is coupled by the NMOS transistor of the first inverter 45 of the first integration circuit 41 to the ground node. At the same time, while the second control signal INB has the low value, the PMOS transistor of the first inverter 50 of the second integration circuit 42 turns on, and the mirrored bit line current iBL<A> flows, from the current mirror 35, through the first inverter 50 of the second integration circuit 42 to charge the capacitor CB.

Therefore, for time t>t2, the mirrored bit line current iBL<A> flows, from the current mirror 35, only through the first inverter 50 of the second integration circuit 42 and not through the first inverter 45 of the first integration circuit 41.

The mirrored bit line current iBL<A> flowing through the PMOS transistor of the first inverter 50 charges the capacitor CB of the second integration circuit 42. The second integration voltage $V_B$ thus increases in time from time t2.

The second integration voltage $V_B$ increases linearly in time for t>t2; however, the behavior of the second integration voltage $V_B$ depends on the specific behavior of the bit line current iBL<A>.

While the first control signal INA has the high value, the capacitor CA of the first integration circuit 41 discharges to ground through the NMOS transistor of the first inverter 45. The first integration voltage $V_A$ thus decreases to zero.

When the second integration voltage $V_B$ becomes equal to the second threshold voltage Vth2 (at time t3), the output of the second inverter 53 changes to logic low.

Accordingly, at a time t4, the second control signal INB assumes the high value, similarly to what has been discussed above for the first control signal INA in correspondence of time t2.

In response to the second integration voltage $V_B$ reaching the second threshold Vth2, the second switch signal switches to the low value and the second switch SwB closes. In response, the second control signal INB assumes the high value.

The time delay between time t3 and time t4 may correspond, for example, to the propagation delay of the second inverter 53 of the second integration circuit 42 and/or the switching time of the second switch SwB.

For the time period t3<t<t4, the mirrored bit line current iBL<A> continues to charge the capacitor CB of the second integration circuit 42; accordingly, the second integration voltage $V_B$ increases up to a maximum value (instant t4).

For the time period t2<t<t4, the switching circuit 43 keeps the first control signal INA at the high value and the second control signal INB at the low value.

At the time instant t4, the first control signal INA assumes the low value again, in response to the second control signal INB assuming the high value.

In response to the first control signal INA assuming the low value, the mirrored bit line current iBL<A> returns to charging the capacitor CA of the first integration circuit 41. The previous process then repeats.

With reference to FIG. 3, the counter stage 34, in particular the ripple counter circuit formed by the connected flip-flops 67.1, . . . , 67.F, counts the number of pulses in the first control signal INA. More specifically, the counter stage functions to count the number of switching events of the first control signal INA, and even more particularly in this embodiment counts the number of rising edges of the first control signal INA.

In practice, each ADC circuit digital detector 22 measures the bit line current iBL<A> of the positive elaboration bit line BL<A>+ or negative elaboration bit line BL<A>- selected by the column selection circuit (dependent on the logic state of the elaboration control signal ELAB) by performing a number of successive sampling iterations. In each sampling iteration, for example with respect to a sampling iteration wherein the mirrored bit line current iBL<A> flows through the first integration circuit 41, the integration stage 33 generates the first integration voltage $V_A$ as the time integral of the mirrored bit line current iBL<A>, compares the first integration voltage $V_A$ with the first threshold Vth1 and, in response to the first integration voltage $V_A$ reaching the first threshold Vth1, resets the first integration voltage $V_A$, in particular here by switching the first control signal INA. The counter stage 34 increments the count value with each switching of the first control signal INA.

In other words, each digital detector 22 samples each respective bit line current iBL<A> by converting the bit line current iBL<A> into a number of charge packets indicated by pulses of the first control signal INA and counting those charge packets, wherein each charge packet corresponds to the charge accumulated on the capacitors CA, CB that causes a switch of the second inverters 48, 53.

According to the illustrated embodiment, the switching circuit 43 disables the first integration circuit 41 and enables the second integration circuit 42, in response to the first integration signal $V_A$ reaching the first threshold Vth1, and enables the first integration circuit 41 and disables the second integration circuit 42, in response to the second integration signal $V_B$ reaching the second threshold Vth2. This allows the bit line current iBL<A> to be sampled alternatively by the first integration circuit 41 and the second integration circuit 42, thereby allowing the bit line current iBL<A> to charge the capacitor CA while the capacitor CB is discharging, and to charge the capacitor CB while the capacitor CA is discharging. By doing so, no bit line charge is lost during the sampling and the digital detector 22 may achieve a high measurement accuracy of the bit line current iBL<A>.

Figure 5:
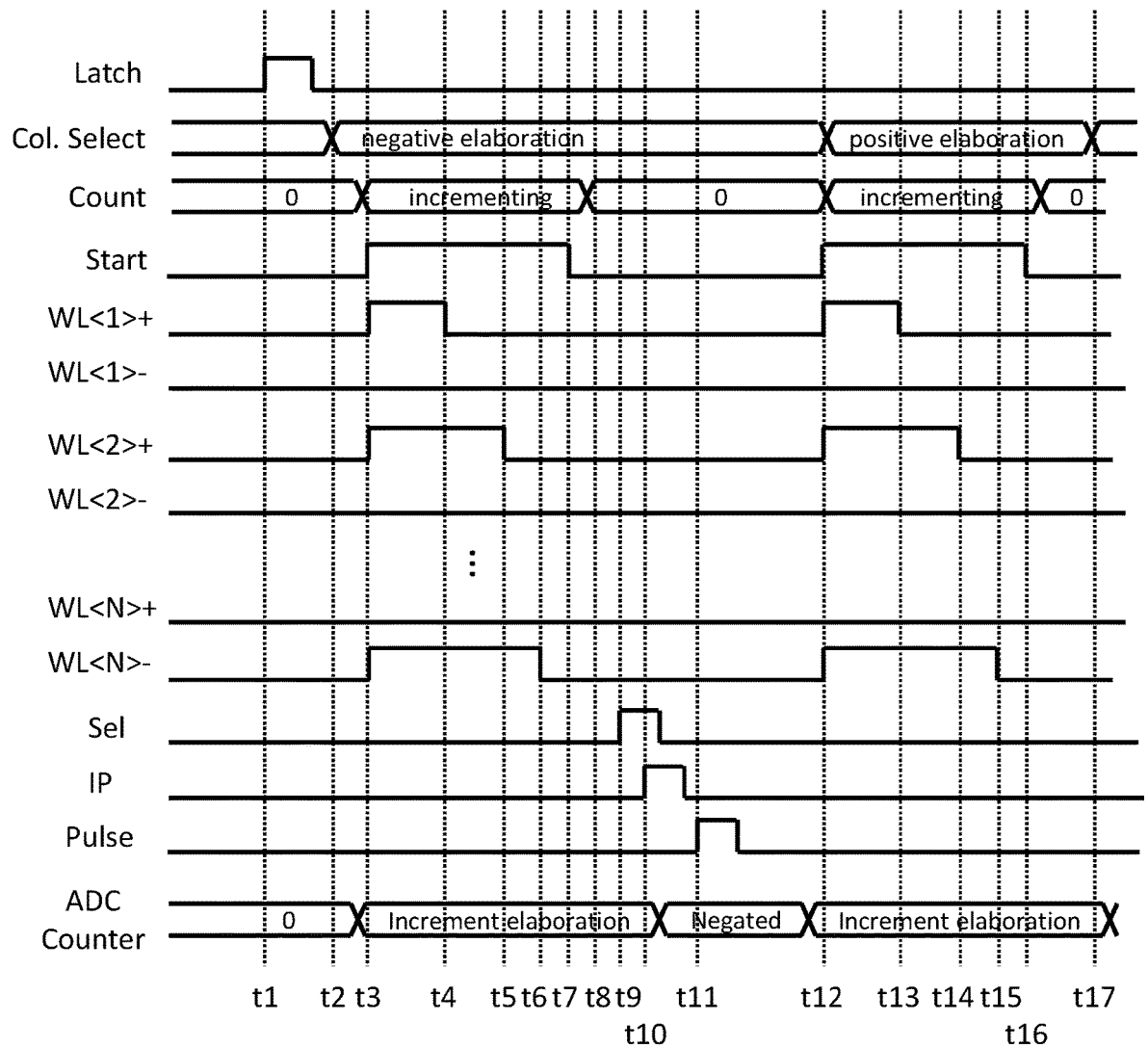
FIG. 5 is a timing diagram illustrating an in-memory compute operation using the circuit of FIG. 1.

Reference is now made to FIG. 5 which shows a simplified timing diagram for operation of the circuit 110 in connection with one overall in-memory compute operation including two separate elaborations (i.e., one negative elaboration followed by one positive elaboration). At time t1, a latch control signal is asserted to cause the latch circuits $152_1$ to $152_N$ to latch the signed digital values of the coefficient data $X_1$ to $X_N$, and the overall in-memory compute operation begins. At time t2, responsive to a first logic state (for example, logic 0) of an elaboration indicator signal (ELAB) generated by the control circuit, the column select circuitry of the column processing circuit 120 selects the negative elaboration bit lines BL<A>− through the multiplexing in connection with performing the negative elaboration of the in-memory compute operation. We assume here the example discussed above and shown in FIG. 1 where there is a simultaneous selection of all rows of groups $115_{AB}$ of memory cells 114 in response to the non-zero values of the coefficient data, and the simultaneous actuation in response to assertion of the $Start_B$ signals at time t3 of the word lines WL<1>+, WL<2>+ corresponding to the positive feature or coefficient data $X_1$, $X_2$ with pulsed word line signals and also the word line WL<N>− corresponding to the negative feature or coefficient data $X_N$ with a pulsed word line signal. Also at time t3, the previously reset Count value begins to increment. At time t4, the incrementing Count value meets or exceeds the digital value of the coefficient data $X_1$, and the word line signal pulse on the positive word line WL<1>+ terminates. At time t5, the incrementing Count value meets or exceeds the digital value of the coefficient data $X_2$, and the word line signal pulse on the positive word line WL<2>+ terminates. At time t6, the incrementing Count value meets or exceeds the digital value of the coefficient data $X_N$, and the word line signal pulse on the negative word line WL<N>− terminates. At time t7, the Start signal is deasserted and the Count value is reset.

Starting at time t3, each ADC begins integrating the bit line current iBL<A> from the negative elaboration bit lines BL<A>− to generate a first series of pulses and the count value in the ripple counter increments in response to each pulse of the first series. The incrementing of the count value for the negative elaboration continues until time t8 which is after all word lines have been deactuated. At time t9, the control circuit asserts the select signal Sel to disconnect the ripple counter configuration and cause the multiplexers 68 in each ADC circuit to pass the inverse pulse IP signal at time t10. In response to the application of the inverse pulse IP signal to the clock inputs of the D flip-flops 67 in each ADC circuit, the bits of the count value for the negative elaboration are logically inverted (performing step a) of the 2's complement operation as discussed above). The select signal is then deasserted to cause the multiplexers 68 in each ADC circuit to revert back to the ripple counter connection and the control circuit then applies a single pulse Pulse to the input of the ripple counter at time t11. This will cause an increment by one of the logically inverted bits of the count value (performing step b) of the 2's complement operation as discussed above). This will produce, through the 2's complement operation, a negated elaboration value to reside in the D flip-flops 67 in each ADC circuit.

At time t12, responsive to a second logic state (for example, logic 1) of the elaboration indicator signal (ELAB) generated by the control circuit, the column select circuitry of the column processing circuit 120 selects the positive elaboration bit lines BL<A>+ through the multiplexing in connection with performing the positive elaboration of the in-memory compute operation. We again assume here the example discussed above and shown in FIG. 1 where there is a simultaneous selection of all rows of groups $115_{AB}$ of memory cells 114 in response to the non-zero coefficient data, and the simultaneous actuation in response to assertion of the $Start_B$ signals at time t12 of the word lines WL<1>+, WL<2>+ corresponding to the positive feature or coefficient data $X_1$, $X_2$ with pulsed word line signals and the word line WL<N>− corresponding to the negative feature or coefficient data $X_N$ with a pulsed word line signal. Also at time t12, the previously reset Count value begins to increment. At time t13, the incrementing Count value meets or exceeds the digital value of the coefficient data $X_1$, and the word line signal pulse on the positive word line WL<1>+ terminates. At time t14, the incrementing Count value meets or exceeds the digital value of the coefficient data $X_2$, and the word line signal pulse on the positive word line WL<2>+ terminates. At time t15, the incrementing Count value meets or exceeds the digital value of the coefficient data $X_N$, and the word line signal pulse on the negative word line WL<N>− terminates. At time t16, the Start signal is deasserted and the Count value is reset. At time t17, the positive elaboration ends.

Starting at time t12, each ADC begins integrating the bit line current iBL<A> from the positive elaboration bit lines BL<A>+ to generate a second series of pulses and the count value in the ripple counter increments starting from the negated elaboration value (produced as noted above by performing the 2's complement operation on the count value for the negative elaboration) in response to each pulse of the second series. The incrementing of the count value for the positive elaboration continues until time t16 when all word lines have been deactuated. At time t17, when the positive elaboration ends to resulting count value in the D flip-flops 68 of each ADC circuit may be output as the digital signal $dY_A$.

Figure 6:
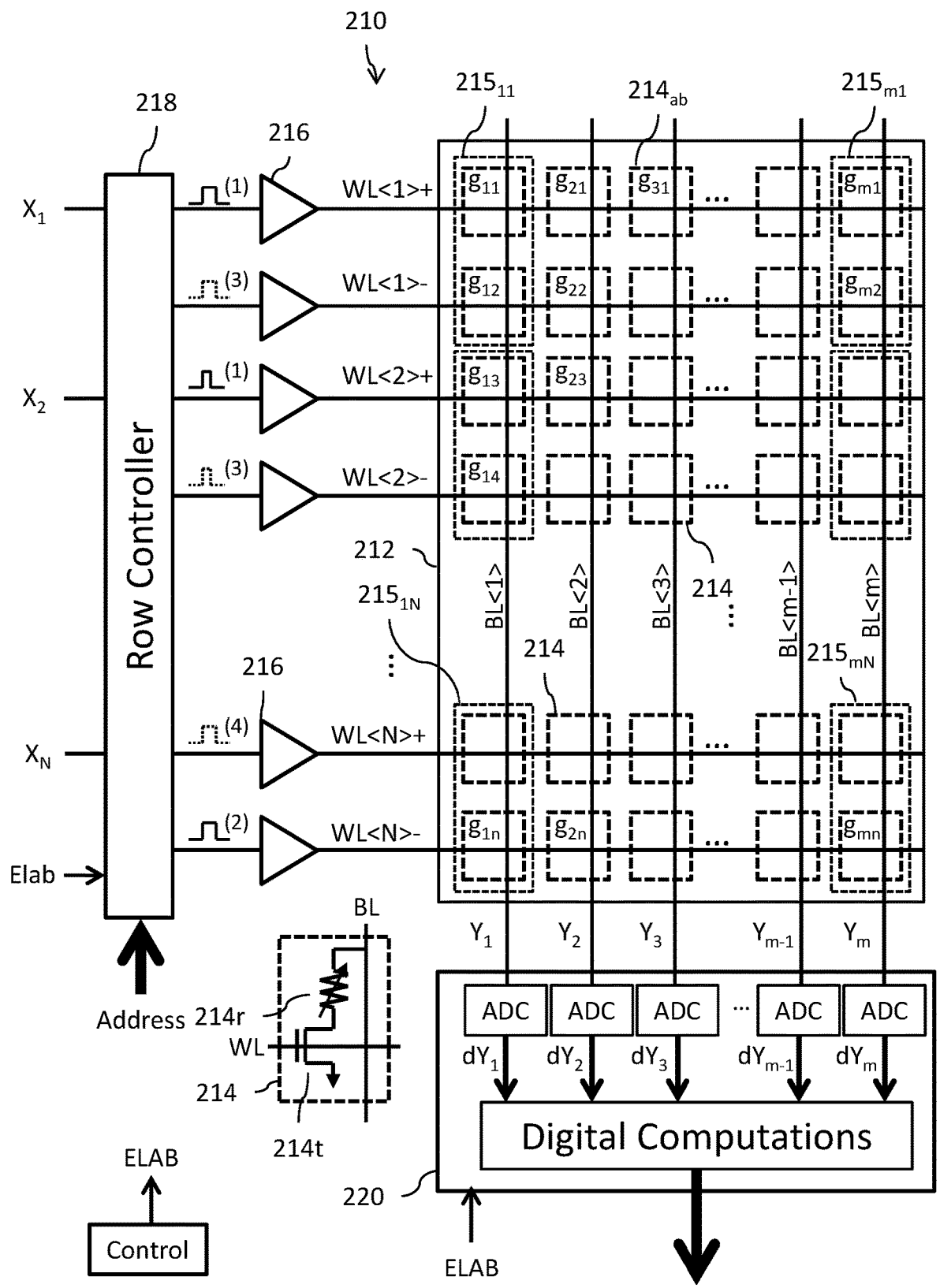
FIG. 6 is a schematic diagram of an embodiment for an in-memory computation circuit.

Reference is now made to FIG. 6 which shows a schematic diagram of an in-memory computation circuit 210. The circuit 210 utilizes a memory array 212 formed by a plurality of memory cells $214_{ab}$ arranged in a matrix format having m columns and n rows, where a is an integer from 1 to m and b is an integer from 1 to n. The array 212 is arranged to include groups $215_{11}$ to $215_{mN}$ of memory cells 114, wherein each group $215_{aB}$ includes two memory cells arranged in a 1×2 matrix, where a is an integer from 1 to m and B is an integer from 1 to N. With this arrangement, there are N rows of groups $215_{aB}$ and m columns of groups $215_{aB}$ (where N=n/2).

Each group $215_{aB}$ of memory cells 214 stores a signed computational weight (also referred to as kernel data) for an in-memory compute operation. Each memory cell 214 can be programmed to store a bit of data $g_{ab}$, with the two bits of data $g_{ab}$ stored by the corresponding two memory cells of each group $215_{aB}$ forming the signed computational weight of that group $215_{aB}$. Each bit of data has either a logic "1" or a logic "0" value which is represented, for example, by a programmable conductance in the memory cell 214. A signed computational weight of "+1" for a given group $215_{aB}$ is represented by programming logic "1" in an upper memory cell (for example, see $g_{11}=1$ of group $215_{11}$), and programming logic "0" in a lower memory cell (for example, see $g_{12}=0$ of group $215_{11}$) as illustrated by the matrix $$\begin{bmatrix} 1 \\ 0 \end{bmatrix},$$

also referred to in the art as a (positive) single entry matrix. A signed computational weight of "−1" for a given group $215_{aB}$ is represented by programming logic "0" in the upper memory cell (for example, see $g_{11}=0$ of group $215_{11}$), and programming logic "1" in a lower memory cell (for example, see $g_{12}=1$ of group $215_{11}$) as illustrated by the matrix:

$$\begin{bmatrix} 0 \\ 1 \end{bmatrix},$$

also referred to in the art as a (negative) single entry matrix. A signed computational weight of "0" for a given group $215_{aB}$ is represented by programming logic "0" in both memory cells (for example, see $g_{11}=0$, $g_{12}=0$ of group $215_{11}$) as illustrated by the matrix:

$$\begin{bmatrix} 0 \\ 0 \end{bmatrix},$$

also referred to in the art as a zero matrix.

In an embodiment of the memory array 212, each memory cell 214 comprises a phase change memory (PCM) cell formed by a select circuit (MOSFET transistor, BJT transistor, diode device, etc.) 214t operating as a switching element and a variable resistive element 214r providing a programmable conductance. In the case of a MOSFET transistor for the select circuit 214t, the control node (gate) of the MOSFET transistor is connected to the word line WL. The source-drain path of the MOSFET transistor is connected in series with the variable resistive element 214r between the bit line BL and a reference node (for example, a source line or ground). More specifically, a drain of the MOSFET transistor is connected to a first terminal of the variable resistive element 214r, the source of the MOSFET transistor is connected to the reference node, and the second terminal of the variable resistive element 214r is connected to the bit line BL.

As is well known to those skilled in the art, a PCM-type memory cell 214 is configured to store data using a phase change material (such as a chalcogenide) that is capable of stably transitioning between amorphous and crystalline phases according to an amount of heat transferred thereto. The amorphous and crystalline phases exhibit two or more distinct resistances (corresponding to the variable resistive element 214r), in other words two or more distinct conductances, which are used to distinguish two or more distinct logic states programmable into the memory cell. The amorphous phase exhibits a relatively higher resistance (i.e., a lower conductance) and thus the current sunk from the bit line BL by the memory cell programmed in this state when selected by assertion of the word line signal at the gate of the select circuit 214t is relatively smaller. Conversely, the crystalline phase exhibits a relatively lower resistance (i.e., a higher conductance) and thus the current sunk from the bit line BL by the memory cell programmed in this state when selected by assertion of the word line signal at the gate of the select circuit 214t is relatively larger.

In an embodiment for a specific, but non-limiting, example for two distinct logic states: the amorphous phase may represent programming of the memory cell to logic "0" (or reset state) for the associated coefficient weight and the crystalline phase may represent programming of the memory cell to logic "1" (or set state) for the associated coefficient weight. Although binary (i.e., two distinct logic states) data is described in detail herein, it will be understood that the memory cell 214 may instead support storage of m-ary (i.e., three or more distinct logic states) data in some applications.

It will be understood that other memory cell types could instead be used for the array 212. For example, magnetoresistive random access memory (MRAM) cells or resistive random access memory (RRAM) cells could be used. The memory cell may alternatively comprise a static random access memory (SRAM) cell.

Each memory cell 214 includes a word line WL and a bit line BL. The memory cells 214 in a common row of the matrix are connected to each other through a common word line WL. The groups $215_{aB}$ of memory cells 214 in a common row of groups $215_{aB}$ are connected to each other through a positive word line WL<B>+ and a negative word line WL<B>− (which form a word line pair for the common row of groups $215_{aB}$). More specifically, the positive word line WL<B>+ is connected to the upper memory cell in the 1×2 matrix for the group (for example, see WL<1>+ for $g_{11}$ of group $215_{11}$), while the negative word line WL<B>− is connected to the lower memory cell in the 1×2 matrix for the group (for example, see WL<1>− for $g_{12}$ of group $215_{11}$).

The memory cells 214 in a common column of the matrix are connected to each other through a common bit line BL. The groups $215_{aB}$ of memory cells 214 in a common column of groups $215_{aB}$ are connected to each other through a bit line BL<a>. More specifically, the bit line BL<a> is connected to the two memory cells in the 1×2 matrix for the group (for example, see BL<1> for $g_{11}$ and $g_{12}$ of group $215_{11}$).

Each word line WL is driven by a word line driver circuit 216 with a pulsed word line signal generated by a row controller circuit 218. The word line driver circuit 216 may be implemented as a CMOS driver or buffer circuit (for example, formed by the series connection of two CMOS logic inverters).

The row controller circuit 218 receives the signed feature or coefficient data $X_1$ to $X_N$ for the in-memory compute operation. The row controller circuit 218 also receives an address signal (Address) for the in-memory compute operation and in response thereto selectively loads the signed feature or coefficient data $X_1$ to $X_N$ for association with the rows of groups $215_{AB}$ of memory cells 214 which are to be simultaneously selected in parallel during each elaboration of the analog in-memory compute operation. During the simultaneous access for a given elaboration, only one word line of each word line pair (WL<B>+ or WL<B>−) is actuated with a pulsed word line signal. The actuated one word line of the word line pair is selected based on: a) which one of a positive elaboration or a negative elaboration is being performed (this being indicated by the logic state of an elaboration control signal ELAB generated by a control circuit), and b) the logic state of the sign bit of the feature or coefficient data $X_B$. For example, consider the following cases: Case (1) if the positive elaboration is being performed (signal ELAB is logic 1) and the sign bit is logic 0, indicative of a positive coefficient data value, then the positive word line WL<B>+ is asserted; Case (2) if the positive elaboration is being performed (signal ELAB is logic 1) and the sign bit is logic 1, indicative of a negative coefficient data value, then the negative word line WL<B>− is asserted; Case (3) if the negative elaboration is being performed (signal ELAB is logic 0) and the sign bit is logic 0, indicative of a positive coefficient data value, then the negative word line WL<B>− is asserted; and Case (4) if the negative elaboration is being performed (signal ELAB is logic 0) and the sign bit is logic 1, indicative of a negative coefficient data value, then the positive word line WL<B>+ is asserted. The row controller circuit 218 still further controls, for each corresponding actuated word line, the width (i.e., the on time $T_{ON}$) of the generated pulsed word line signal. This functionality is a form of a pulse width modulation (PWM) control for the applied word line signals dependent on the digital value of the received signed feature or coefficient data $X_B$.

In an embodiment, the signed feature or coefficient data $X_B$ is provided in a multi-bit signed binary format, with a 4-bit example as set forth in the following table:

| Decimal | Binary | Decimal | Binary |
|---------|--------|---------|--------|
| 0       | 0000   | 0       | 1000   |
| +1      | 0001   | −1      | 1001   |
| +2      | 0010   | −2      | 1010   |
| +3      | 0011   | −3      | 1011   |
| +4      | 0100   | −4      | 1100   |
| +5      | 0101   | −5      | 1101   |
| +6      | 0110   | −6      | 1110   |
| +7      | 0111   | −7      | 1111   |

The use of a 4-bit format for the signed feature or coefficient data $X_B$ is just an example, it being understood that the signed feature or coefficient data $X_B$ can use any selected number of bits depending on the computation application.

It will be noted that the most significant bit of the signed binary feature or coefficient data $X_B$ provides the sign bit (logic 0 is positive, logic 1 is negative) used to control selection of the positive (WL<B>+) or negative (WL<B>−) word line of the word line pair dependent on the positive/negative elaboration, while the remaining less significant bits provide the value specifying the pulse width duration for the word line signal applied to that selected word line of the word line pair during each elaboration.

FIG. 6 illustrates, by way of example only, the simultaneous selection of all rows of groups $215_{aB}$ of memory cells 214 in response to non-zero coefficient data, and further illustrates, by way of example only with solid word line signal pulses (with adjacent parenthetical numbers identifying the particular case as noted above), the positive elaboration of the in-memory compute operation (ELAB=1) including the simultaneous actuation of certain positive word lines (WL<1>+ and WL<2>+, for example) corresponding to positively signed feature or coefficient data ($X_1$ and $X_2$, for example) with pulsed word line signals having pulse widths set by the digital value of the corresponding coefficient data (case (1)), along with the simultaneous actuation of certain negative word lines (WL<N>−, for example) corresponding to negatively signed feature or coefficient data ($X_N$, for example) with pulsed word line signals having pulse widths set by the digital value of the corresponding coefficient data (case (2)).

FIG. 6 further illustrates, by way of example only, the simultaneous selection of all rows of groups $215_{aB}$ of memory cells 214 in response to non-zero coefficient data, and further illustrates, by way of example only with dotted word line signal pulses (with adjacent parenthetical numbers identifying the particular case as noted above), the negative elaboration of the in-memory compute operation (ELAB=0) including the simultaneous actuation of certain negative word lines (WL<1>− and WL<2>−, for example) corresponding to positively signed feature or coefficient data ($X_1$ and $X_2$, for example) with pulsed word line signals having pulse widths set by the digital value of the corresponding coefficient data (case (3)), along with the simultaneous actuation of certain positive word lines (WL<N>+, for example) corresponding to negatively signed feature or coefficient data ($X_N$, for example) with pulsed word line signals having pulse widths set by the digital value of the corresponding coefficient data (case (4)).

It will, of course, be understood that the positive/negative elaborations for the analog in-memory compute operation may instead utilize a simultaneous selection of fewer than all rows of groups $215_{aB}$ of memory cells 214 (through either Address signal selection or through a zero value for the coefficient data $X_B$).

The analog signal $Y_a$ developed during each positive or negative elaboration on each bit line BL<a> is dependent on the logic state of the bit of data $g_{ab}$ for the signed computational weight stored in the memory cells 214 of the column and the widths of the pulsed word line signals applied to the word lines WL for those memory cells 214. More specifically, it will be understood that each memory cell 214 contributes a bit line BL discharge current during the elaboration that is proportional to $X_B \times g_{ab}$. So, in the example shown in FIG. 6 where the (solid) word line signals are simultaneously applied to the word lines WL<1>+, WL<2>+, . . . , WL<N>− during the positive elaboration (ELAB=1) of the in-memory compute operation, the analog signal $Y_1$ developed on the bit line BL<1> is proportional to the sum of discharge currents due to $X_1 \times g_{11}$, $0 \times g_{12}$, $X_2 \times g_{13}$, $0 \times g_{14}$, . . . , $0 \times g_{1n-1}$ and $X_N \times g_{1n}$. Conversely, where the (dotted) word line signals are simultaneously applied to the word lines WL<1>−, WL<2>−, . . . , WL<N>+ during the negative elaboration (ELAB=0) of the in-memory compute operation, the analog signal $Y_1$ developed on the same bit line BL<1> is proportional to the sum of discharge currents due to $0 \times g_{11}$, $X_1 \times g_{12}$, $0 \times g_{13}$, $X_2 \times g_{14}$, . . . , $X_N \times g_{1n-1}$ and $0 \times g_{1n}$. The overall result of the in-memory compute operation is a function of the difference between analog signals developed during the positive and negative elaborations.

Let's assume now, for example only, some specific signed computational weights for the groups $215_{aB}$ of memory cells 214 in this column of groups. Group $215_{11}$ is programmed with a weight of −1 which is represented by the matrix $$\begin{bmatrix} 0 \\ 1 \end{bmatrix}.$$

Group $115_{12}$ is programmed with a weight of 0 which is represented by the matrix $$\begin{bmatrix} 0 \\ 0 \end{bmatrix}.$$

Group $115_{1N}$ is programmed with a weight of +1 which is represented by the matrix $$\begin{bmatrix} 1 \\ 0 \end{bmatrix}.$$

So, for this example, the analog signal $Y_1$ developed on the bit line BL<1> during the positive elaboration (ELAB=1), is proportional to the sum of discharge currents due to $X_1 \times 0$, $0 \times 1$, $X_2 \times 0$, $0 \times 0$, ..., $0 \times 1$ and $X_N \times 0$; which would result in zero discharge currents on the bit line BL<1>. The analog signal $Y_1$ developed on the bit line BL<1> during the negative elaboration (ELAB=0), is proportional to the sum of discharge currents due to $0 \times 0$, $X_1 \times 1$, $0 \times 0$, $X_2 \times 0$, ..., $X_N \times 1$ and $0 \times 0$; which results in a sum of discharge currents due to $X_1 \times 1$, ..., and $X_N \times 1$ on the bit line BL<1>.

A column processing circuit 220 includes ADC circuitry coupled to receive a bit line current indicative of the analog signal $Y_{A-}$ developed on the bit line BL<A> during the negative elaboration (ELAB=0) which in this case is performed first. The ADC circuitry converts that bit line current through an integration process to generate a first series of pulses using an integration circuit, and then counts the number of pulses in the first series of pulses using a counter circuit. The counted number of pulses in the first series of pulses, and hence the current count value in the counter circuit at this point, is a digital value converted from bit line current of the analog signal $Y_{A-}$. The ADC circuitry then performs a 2's complement operation on the count value in the counter circuit to produce a negated count value. The ADC circuitry then receives a bit line current indicative of the analog signal $Y_{A+}$ developed on the bit line BL<A> during the positive elaboration (ELAB=1). The ADC circuitry converts that bit line current through the integration process to generate a second series of pulses using the integration circuit, and then counts (starting from the negated count value) the number of pulses in the second series of pulses using the counter circuit. The counted number of pulses in the second series of pulses is a digital value converted from the bit line current of the analog signal $Y_{A+}$. The count value in the counter circuit at this point is the digital signal $dY_A$ which has a digital value equal to the difference between the digital value converted from the analog signal $Y_{A+}$ and digital value converted from the analog signal $Y_{A-}$ (in other words, $dY_A = -(dY_{A-}) + dY_{A+} = dY_{A+} - dY_{A-}$, where "d" signifies the digital value of the analog signal $Y_{A-/+}$ obtained through the integration and counting operations of the ADC circuitry).

Let's consider a specific example to illustrate the operation performed by the column processing circuit 220. During the negative elaboration of the in-memory compute operation (ELAB=0), the bit line current iBL<A> on the bit line BL<A> is integrated to generate a first series of pulses. The value in the counter circuit is incremented by one in response to each of the 350 pulses in the first series of pulses and thus the binary value in the counter circuit is (0b 01 0101 1110=350). Next, the ADC circuitry performs a 2's complement operation on the count value in the counter circuit to produce a negated count value. This 2's complement operation involves: a) inverting the logic state of each bit of the value in the counter circuit to produce (0b 10 1010 0001=− 351); and the b) adding one to produce the negated count value in the counter circuit as (0b 10 1010 0010=−350). During the positive elaboration of the in-memory compute operation (ELAB=1), the bit line current iBL<A> on the bit line BL<A> is integrated to generate a second series of pulses. The negated value in the counter circuit is incremented by one in response to each of the 200 pulses in the second series of pulses and thus the binary value in the counter circuit is (0b 11 0110 1010=−150).

The column processing circuit 220 further includes digital signal processing circuitry for storing the resulting digital signals $dY_A$ for the in-memory compute operation and performing digital computations and calculations on the digital signals $dY_A$ to generate a decision output for the in-memory compute operation.

Although FIG. 6 illustrates that one analog-to-digital converter (ADC) is provided for each bit line, it will be understood that ADC resources in the column processing circuit 220 could instead be shared by multiple bit lines using time division multiplexing.

Although not explicitly shown in FIG. 6, it will be understood that the circuit 210 further includes conventional row decode, column decode, and read-write circuits known to those skilled in the art for use in connection with writing bits of data (for example, the computational weight data) to, and reading bits of data from, the memory cells 214 of the memory array 212. This operation is referred to as a conventional memory access mode and is distinguished from the analog in-memory compute operation discussed above.

It will be noted that an advantage of the FIG. 6 implementation is that the signed computational weight for the in-memory compute operation is coded on two memory cells 214 forming the group $215_{aB}$ with a 1×2 matrix configuration, while the FIG. 1 implementation utilizes four memory cells 114 forming the group $115_{AB}$ with a 2×2 matrix configuration. There is accordingly a 2× memory reduction for the array 212 compared to the array 112 (or there is a 2× increase in weight storage capacity for the array 212 compared to the array 112).

Figure 7:
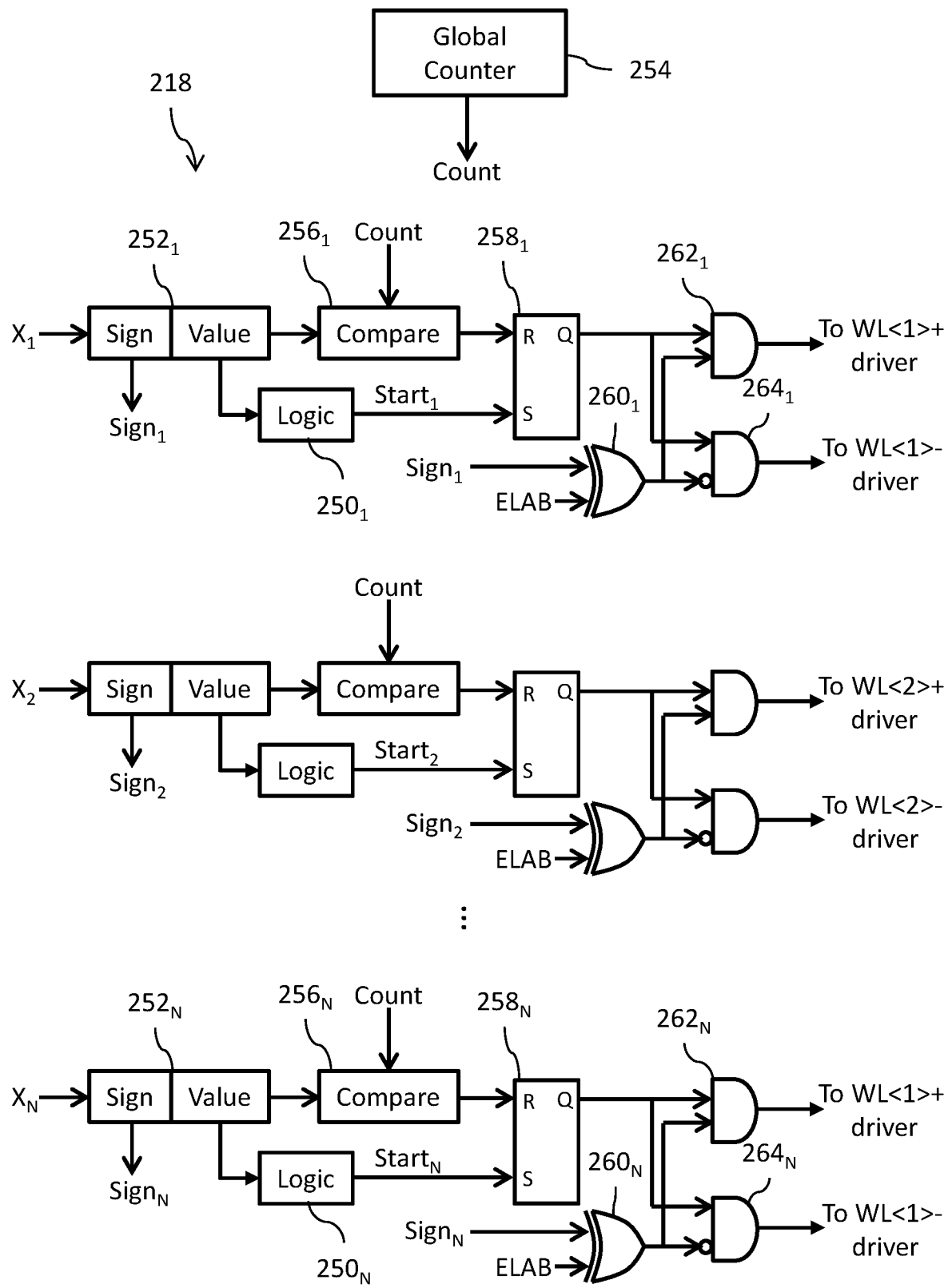
FIG. 7 shows a circuit diagram for a row controller circuit used by the in-memory computation circuit of FIG. 6.

Reference is now made to FIG. 7 which shows a circuit diagram for the row controller 218. A latch circuit $252_B$ is provided for each row of groups $215_{aB}$ of memory cells 214 to latch the corresponding sign and value of the signed digital value of the coefficient data $X_B$. A logic circuit $250_B$ is provided for each row of groups $215_{aB}$ of memory cells 214. The logic circuits $250_1$ to $250_N$ assert a start signal ($Start_B$), for example in response to a global start signal generated by the control circuit, at a beginning of each elaboration of the positive and negative elaborations of the in-memory compute operation. The generation of this start signal may, for example, be dependent on the corresponding signed digital value of the coefficient data $X_B$ having a non-zero value for the analog in-memory compute operation. A global counter circuit 254 increments a count value (Count) starting from a zero reset at the beginning of each (positive and/or negative) elaboration for the in-memory compute operation, wherein the elaboration ends when the Count reaches a maximum value. A compare circuit $256_B$ for each row of groups $215_{aB}$ of memory cells 214 is coupled to the latch circuit $252_B$ and compares the count value Count to the latched digital value of the coefficient data $X_B$. The output of the compare circuit $256_B$ is asserted when the count value Count meets or exceeds the latched digital value. A set-reset latch circuit $258_B$ has a set(S) input coupled to receive the $Start_B$ signal output from the logic circuit $250_B$ and a reset (R) input coupled to receive the output of the compare circuit $256_B$. A combinational logic circuit $260_B$ logically combines the sign bit $Sign_B$ from the latch circuit $252_B$ and the elaboration indicator signal (ELAB). The toggling logic state of the elaboration indicator signal ELAB indicates whether the positive elaboration is being performed (logic 1) or the negative elaboration is being performed (logic 0). In an embodiment, the combinational logic circuit $260_B$ is a logic exclusive OR (XOR) gate. A combinational logic circuit $262_B$ logically combines the output (Q) of the set-reset latch circuit $258_B$ and the output of the combinational logic circuit $260_B$ to generate the pulsed word line signal for application to the driver circuit 216 of the positive word line WL<B>+. A combinational logic circuit $264_B$ logically combines the output (Q) of the set-reset latch circuit $258_B$ and the logical inverse of the output of the combinational logic circuit $260_B$ to generate the pulsed word line signal for application to the driver circuit 216 of the negative word line WL<B>−. In an embodiment, the combinational logic circuits $262_B$ and $264_B$ are logic AND gates.

Operation of the circuitry within the row controller 218 is as follows: At the beginning of the in-memory compute operation, decoding of the address signal Address is used to selectively load the digital values of the coefficient data $X_1$ to $X_N$ to be latched by the latch circuits $252_1$ to $252_N$, and the global counter 254 is reset. If the coefficient data is non-zero, there is a selection of the row of groups $215_{aB}$ of memory cells 214, and the start signal $Start_B$ output of the logic circuit $250_B$ is asserted logic high at the beginning of each elaboration of the positive and negative elaborations, and the set-reset latch circuit $258_B$ is set with its output Q logic high. The logic state of the toggling elaboration indicator control signal ELAB indicates whether the positive elaboration is being performed (logic 1) or the negative elaboration is being performed (logic 0). Consideration is now made to each of the four cases noted above. Case (1): if the sign bit $Sign_B$ is logic 0, indicating that the digital value of the coefficient data $X_B$ is positive, and the elaboration indicator control signal ELAB is logic 1, indicating the positive elaboration of the in-memory compute operation is being performed, the inputs of the XOR gate $260_B$ are opposite logic and the output of the XOR gate $260_B$ is logic high. Here, both inputs of the AND gate $262_B$ are logic high and the output of the AND gate $262_B$ transitions to logic high to provide the leading edge of the word line signal pulse on the positive word line WL<B>+. Case (2): if the sign bit $Sign_B$ is logic 1, indicating that the digital value of the coefficient data $X_B$ is negative, and the elaboration indicator control signal ELAB is logic 1, indicating the positive elaboration of the in-memory compute operation is being performed, both inputs of the XOR gate $260_B$ are logic high and the output of the XOR gate $260_B$ is logic low. Here, both inputs of the AND gate $264_B$ are logic high and the output of the AND gate $264_B$ transitions to logic high to provide the leading edge of the word line signal pulse on the negative word line WL<B>−. Case (3): if the sign bit $Sign_B$ is logic 0, indicating that the digital value of the coefficient data $X_B$ is positive, and the elaboration indicator control signal ELAB is logic 0, indicating the negative elaboration of the in-memory compute operation is being performed, both inputs of the XOR gate $260_B$ are logic low and the output of the XOR gate $260_B$ is logic low. Here, both inputs of the AND gate $264_B$ are logic high and the output of the AND gate $264_B$ transitions to logic high to provide the leading edge of the word line signal pulse on the negative word line WL<B>−. Case (4): if the sign bit $Sign_B$ is logic 1, indicating that the digital value of the coefficient data $X_B$ is negative, and the elaboration indicator control signal ELAB is logic 0, indicating the negative elaboration of the in-memory compute operation is being performed, the inputs of the XOR gate $260_B$ are opposite logic and the output of the XOR gate $260_B$ is logic high. Here, both inputs of the AND gate $262_B$ are logic high and the output of the AND gate $262_B$ transitions to logic high to provide the leading edge of the word line signal pulse on the positive word line WL<B>+. The global counter 254 then begins incrementing the Count value. When the incrementing Count value meets or exceeds the digital value of the coefficient data $X_B$ latched by the latch circuit $252_B$, the output of the compare circuit $256_B$ is asserted logic high, and the set-reset latch circuit $258_B$ is reset with its output Q logic low. This logic low output is applied to both AND gates $262_B$ and $264_B$, and whichever output of those AND gates is logic high (corresponding to assertion of the word line signal pulse) will transition to logic low to provide the trailing edge of the word line signal pulse. The pulse width (i.e., the on time $T_{ON}$) of the generated pulsed word line signal is thus dependent on the amount of time needed for the incrementing Count value to reach the digital value of the coefficient data $X_B$. When the Count reaches its maximum value, the given elaboration ends. If that given elaboration is the first elaboration of the in-memory compute operation, the process is repeated for the second elaboration of the in-memory compute operation.

Figure 8:
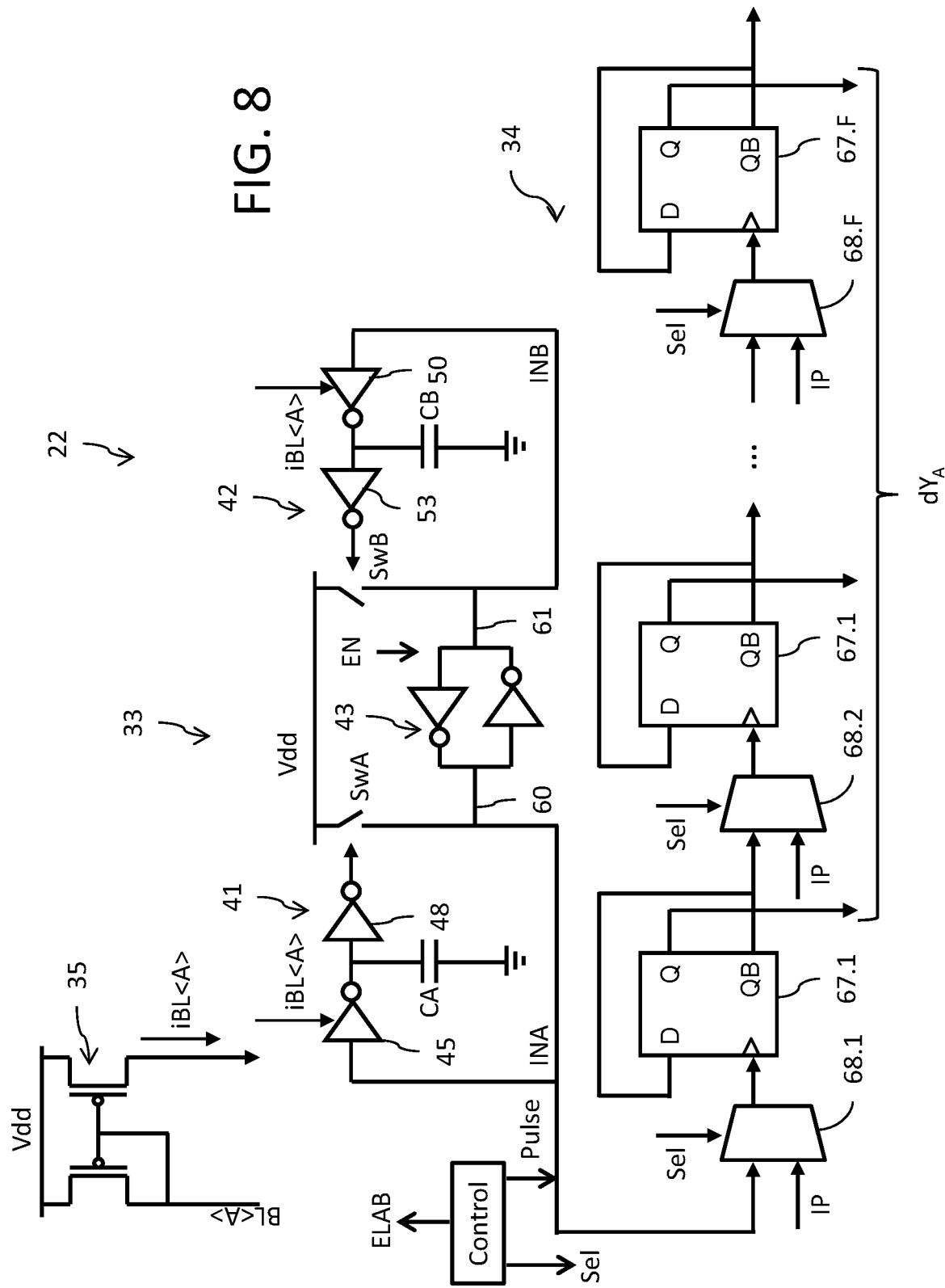
FIG. 8 shows a circuit diagram for an analog-to-digital converter circuit used by the in-memory computation circuit of FIG. 6.

Reference is now made to FIG. 8 which shows a circuit diagram for an instance of the ADC circuit (referred to herein as a digital detector 22 circuit). Like references in FIGS. 3 and 8 refer to same or similar components. The digital detector 22 in FIG. 8 differs from the digital detector 22 in FIG. 3 only with respect to the interface with the bit lines. In FIG. 3, each ADC circuit digital detector 22 is coupled to a respective bit line pair BL<A>+ and BL<A>− through the column selection circuit controlled by the elaboration signal ELAB. The circuit 210 of FIG. 6 does not use separate bit lines for the positive and negative elaborations. Instead, each bit line time multiplexes the positive and negative elaborations on a given bit line. So, the digital detector 22 in FIG. 8 omits the column selection circuit and instead couples the bit line BL<A> directly to the current mirror circuit 35. The current iBL<A> flowing through the bit line BL<A> is mirrored by the current mirror circuit 35 and applied as the bias current for the first inverters 45 and 50 of the first and second integration stages 41 and 42, respectively. The circuit configuration and operation of the digital detector 22 in FIG. 8 is otherwise identical to the circuit configuration and operation of the digital detector 22 in FIG. 3. See, description above.

Figure 9:
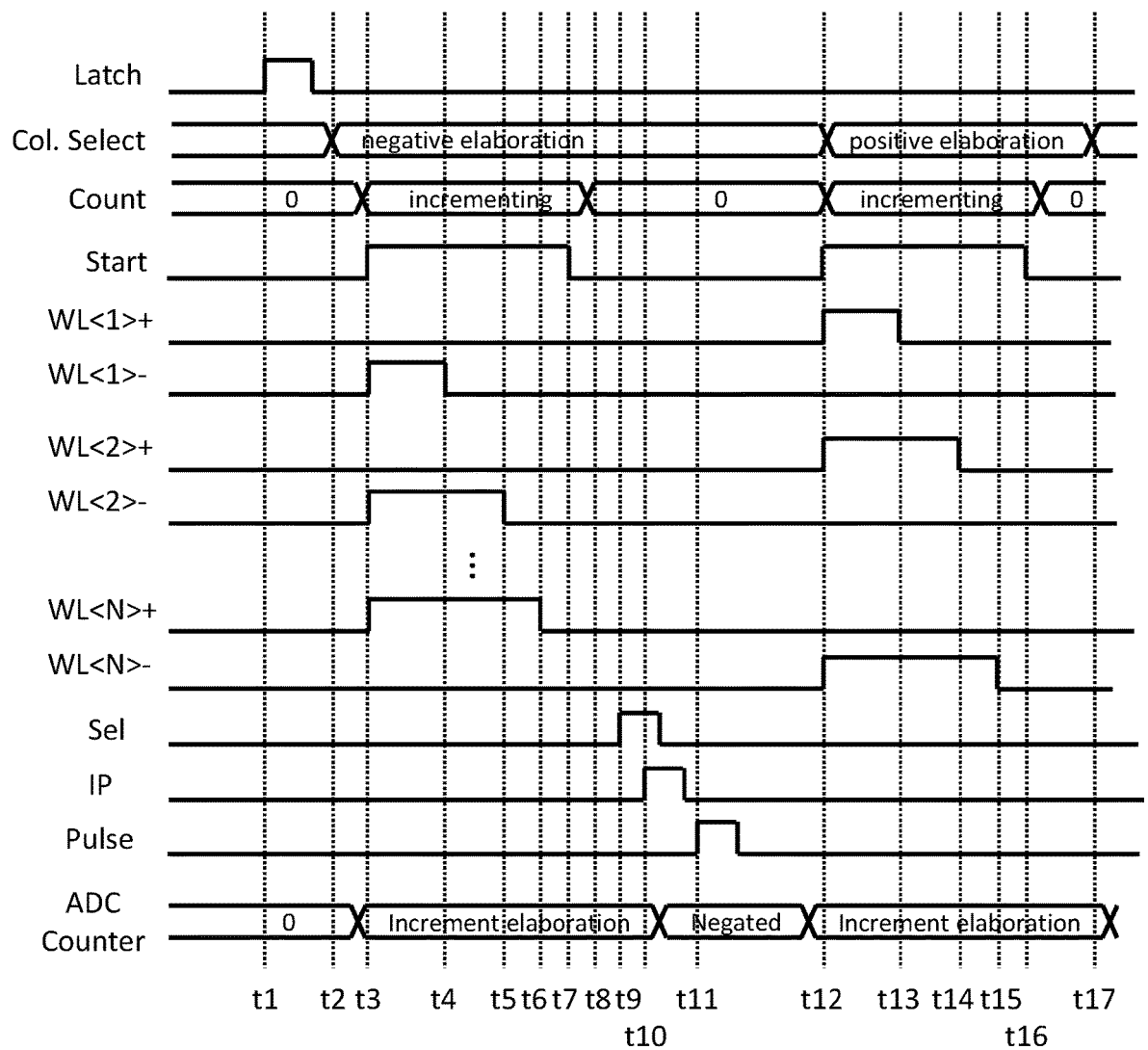
FIG. 9 is a timing diagram illustrating an in-memory compute operation using the circuit of FIG. 6.

Reference is now made to FIG. 9 which shows a simplified timing diagram for operation of the circuit 210 in connection with one overall in-memory compute operation including two separate elaborations and use of the circuit 218. At time t1, a latch control signal is asserted to cause the latch circuits $252_1$ to $252_N$ to latch the signed digital values of the coefficient data $X_1$ to $X_N$, and the overall in-memory compute operation begins. At time t2, the elaboration indicator signal ELAB toggles to logic 0 in connection with starting the negative elaboration of the in-memory compute operation. We assume here the example discussed above and shown in FIG. 6 where, during the negative elaboration of the in-memory compute operation, there is a simultaneous selection of all rows of groups $215_{aB}$ of memory cells 214 in response to the non-zero coefficient data, and the simultaneous actuation in response to assertion of the Start signals at time t2 of the word lines WL<1>−, WL<2>− corresponding to the positive feature or coefficient data $X_1$, $X_2$ with pulsed word line signals (case (3)) and also the word line WL<N>+ corresponding to the negative feature or coefficient data $X_N$ with a pulsed word line signal (case (4)). Also at time t3, the previously reset Count value begins to increment. At time t4, the incrementing Count value meets or exceeds the digital value of the coefficient data $X_1$, and the word line signal pulse on the negative word line WL<1>− terminates. At time t5, the incrementing Count value meets or exceeds the digital value of the coefficient data $X_2$, and the word line signal pulse on the negative word line WL<2>− terminates. At time t6, the incrementing Count value meets or exceeds the digital value of the coefficient data $X_N$, and the word line signal pulse on the positive word line WL<N>+ terminates. At time t8, the Start signal is deasserted and the Count value is reset.

Starting at time t3, each ADC begins integrating the bit line current iBL<A> from the bit lines BL<A> to generate a first series of pulses and the count value in the ripple counter increments in response to each pulse of the first series. The incrementing of the count value for the negative elaboration continues until time t8 which occurs after all word lines have been deactivated. At time t9, the control circuit asserts the select signal Sel to disconnect the ripple counter configuration and cause the multiplexers 68 in each ADC circuit to pass the inverse pulse IP signal at time t10. In response to the application of the inverse pulse IP signal to the clock inputs of the D flip-flops 67 in each ADC circuit, the bits of the count value for the negative elaboration are logically inverted (performing step a) of the 2's complement operation as discussed above). The select signal is then deasserted to cause the multiplexers 68 in each ADC circuit to revert back to the ripple counter connection and the control circuit then applies a single pulse Pulse to the input of the ripple counter at time t11. This will cause an increment by one of the logically inverted bits of the count value (performing step b) of the 2's complement operation as discussed above). This will produce, through the 2's complement operation, a negated elaboration value to reside in the D flip-flops 67 in each ADC circuit.

At time t12, the elaboration indicator signal ELAB toggles to logic 1 in connection with starting the positive elaboration of the in-memory compute operation. We again assume here the example discussed above and shown in FIG. 6 where, during the positive elaboration of the in-memory compute operation, there is a simultaneous selection of all rows of groups 215 aB of memory cells 214 in response to the non-zero coefficient data, and the simultaneous actuation in response to assertion of the $Start_B$ signals at time t12 of the word lines WL<1>+, WL<2>+ corresponding to the positive feature or coefficient data $X_1$, $X_2$ with pulsed word line signals (case (1)) and also the word line WL<N>- corresponding to the negative feature or coefficient data $X_N$ with a pulsed word line signal (case (2)). Also at time t12, the previously reset Count value begins to increment. At time t13, the incrementing Count value meets or exceeds the digital value of the coefficient data $X_1$, and the word line signal pulse on the positive word line WL<1>+ terminates. At time t14, the incrementing Count value meets or exceeds the digital value of the coefficient data $X_2$, and the word line signal pulse on the positive word line WL<2>+ terminates. At time t15, the incrementing Count value meets or exceeds the digital value of the coefficient data $X_N$, and the word line signal pulse on the negative word line WL<N>- terminates. At time t16, the Start signal is deasserted and the Count value is reset.

Starting at time t12, each ADC begins integrating the bit line current iBL<A> from the bit lines BL<A> to generate a second series of pulses and the count value in the ripple counter increments starting from the negated elaboration value (produced as noted above by performing the 2's complement operation on the count value for the negative elaboration) in response to each pulse of the second series. The incrementing of the count value for the positive elaboration continues until time t16 when all word lines have been deactivated. At time t17, when the positive elaboration ends to resulting count value in the D flip-flops 68 of each ADC circuit may be output as the digital signal $dY_A$.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. An in-memory computation circuit, comprising:
    a memory array including a plurality of memory cells arranged in a matrix with plural rows and plural columns, wherein groups of memory cells store computational weights for an in-memory compute (IMC) operation that is performed with a first multiply and accumulate (MAC) elaboration producing a first analog signal and a second MAC elaboration producing a second analog signal; and
    an analog-to-digital converter circuit configured to:
        increment a count value in a counter circuit in response to the first analog signal;
        convert the count value in the counter circuit to a negated count value; and
        increment the count value in the counter circuit starting from the negated count value in response to the second analog signal.

2. The in-memory computation circuit of claim 1, wherein the analog-to-digital converter circuit comprises:
    an integration circuit configured to integrate the first analog signal to produce a first series of pulses, with the counter circuit incrementing the count value in response to each pulse in the first series; and
    wherein the integration circuit is further configured to integrate the second analog signal to produce a second series of pulses, with the counter circuit incrementing the count value starting from the negated count value in response to each pulse of the second series.

3. The in-memory computation circuit of claim 1, wherein the first MAC elaboration is a negative elaboration and the second MAC elaboration is a positive elaboration; and wherein conversion of the count value in the counter circuit to the negated count value is performed through use of a 2's complement operation on the count value.

4. The in-memory computation circuit of claim 1:
    wherein memory cells in each of first ones of the columns of the memory array are connected by a negative elaboration bit line;
    wherein the first analog signal is generated on each negative elaboration bit line during the first MAC elaboration of the in-memory compute operation;
    wherein memory cells in each of second ones of the columns of the memory array are connected by a positive elaboration bit line; and
    wherein the second analog signal is generated on each positive elaboration bit line during the second MAC elaboration of the in-memory compute operation.

5. The in-memory computation circuit of claim 4, wherein the analog-to-digital converter circuit includes a column selection circuit configured to select the first analog signal generated on the negative elaboration bit line during the first MAC elaboration and select the second analog signal generated on the positive elaboration bit line during the second MAC elaboration.

6. The in-memory computation circuit of claim 4, wherein each group of memory cells storing a computational weight comprises four memory cells arranged in a 2×2 matrix with first and second memory cells in the 2×2 matrix of the group connected to the negative elaboration bit line and third and fourth memory cells in the 2×2 matrix of the group connected to the positive elaboration bit line.

7. The in-memory computation circuit of claim 6, wherein a computational weight of −1 is represented by a matrix $$\begin{bmatrix} 0 & 1 \\ 1 & 0 \end{bmatrix},$$

a computational weight of 0 is represented by a matrix $$\begin{bmatrix} 0 & 0 \\ 0 & 0 \end{bmatrix},$$

and a computational weight of +1 is represented by a matrix $$\begin{bmatrix} 1 & 0 \\ 0 & 1 \end{bmatrix}.$$

8. The in-memory computation circuit of claim 6:
wherein first and third memory cells in the 2×2 matrix of the group are connected to a positive word line actuated during the in-memory compute operation in response to positive feature data; and
wherein second and fourth memory cells in the 2×2 matrix of the group are connected to a negative word line actuated during the in-memory compute operation in response to negative feature data.

9. The in-memory computation circuit of claim 5:
wherein memory cells in each column of the memory array are connected by a bit line;
wherein the first analog signal is generated on each bit line during the first MAC elaboration of the in-memory compute operation; and
wherein the second analog signal is generated on each bit line during the second MAC elaboration of the in-memory compute operation.

10. The in-memory computation circuit of claim 9, wherein each group of memory cells storing a computational weight comprises two memory cells arranged in a 1×2 matrix with first and second memory cells in the 1×2 matrix of the group connected to the bit line.

11. The in-memory computation circuit of claim 10, wherein a computational weight of −1 is represented by a matrix $$\begin{bmatrix} 0 \\ 1 \end{bmatrix},$$

a computational weight of 0 is represented by a matrix $$\begin{bmatrix} 0 \\ 0 \end{bmatrix},$$

and a computational weight of +1 which is represented by a matrix $$\begin{bmatrix} 1 \\ 0 \end{bmatrix}.$$

12. The in-memory computation circuit of claim 10:
wherein the first memory cell in the 1×2 matrix of the group is connected to a positive word line actuated during the in-memory compute operation in response to positive feature data; and
wherein the second memory cell in the 1×2 matrix of the group is connected to a negative word line actuated during the in-memory compute operation in response to negative feature data.

13. The in-memory computation circuit of claim 1, wherein the analog-to-digital converter circuit comprises:
an integration stage configured to convert a current provided by each of the first and second analog signals into a number of charge packets indicated by pulses; and
a counting stage comprising a ripple counter having a counter input configured to receive the pulses.

14. The in-memory computation circuit of claim 13, wherein the counting stage comprises:
a plurality of flip-flops;
multiplexing circuitry configured in response to a first logic state of a control signal to connect clock inputs of the plurality of flip-flops to form the ripple counter, and configured in response to a second logic state of the control signal to apply an inverting pulse signal to the clock inputs of the plurality of flip-flops to cause a logical inversion of each bit of the count value stored by the plurality of flip-flops during a logic inversion portion of a 2's complement operation for converting the count value in the counter circuit to the negated count value; and
a control circuit configured to generate the control signal and further apply a single pulse to the counter input of the counting stage during an add one portion of the 2's complement operation for converting the count value in the counter circuit to the negated count value.

15. A method for performing an in-memory compute (IMC) operation, comprising:
performing a first multiply and accumulate (MAC) elaboration of the IMC operation to produce a first analog signal;
incrementing a count value in a counter circuit in response to the first analog signal;
converting the count value in the counter circuit to a negated count value;
performing a second MAC elaboration of the IMC operation to produce a second analog signal; and
incrementing the count value in the counter circuit starting from the negated count value in response to the second analog signal.

16. The method of claim 15, further comprising:
integrating the first analog signal to produce a first series of pulses;
wherein incrementing comprises incrementing the count value in the counter circuit in response to each pulse in the first stream; and
integrating the second analog signal to produce a second series of pulses;
wherein incrementing comprises incrementing the count value in the counter circuit starting from the negated count value in response to each pulse of the second series.

17. The method of claim 15, wherein the first MAC elaboration is a negative elaboration and the second MAC elaboration is a positive elaboration, and converting the count value in the counter circuit to the negated count value comprises performing a 2's complement operation on the count value.

18. The method of claim 15, wherein the IMC operation is performed by an in-memory computation circuit including a memory array including a plurality of memory cells arranged in a matrix with plural rows and plural columns, wherein groups of memory cells store computational weights for the IMC operation;
- wherein memory cells in each of first ones of the columns of the memory array are connected by a negative elaboration bit line;
- wherein memory cells in each of second ones of the columns of the memory array are connected by a positive elaboration bit line;
- the method comprising:
  - generating the first analog signal on each negative elaboration bit line during the first MAC elaboration of the in-memory compute operation; and
  - generating the second analog signal on each positive elaboration bit line during the second MAC elaboration of the in-memory compute operation.

19. The method of claim 18, further comprising selecting the first analog signal generated on the negative elaboration bit line during the first MAC elaboration and selecting the second analog signal generated on the positive elaboration bit line during the second MAC elaboration.

20. The method of claim 18, wherein each group of memory cells storing a computational weight comprises four memory cells arranged in a 2×2 matrix, and wherein:
- first and second memory cells in the 2×2 matrix of the group connected to the negative elaboration bit line and third and fourth memory cells in the 2×2 matrix of the group connected to the positive elaboration bit line; and
- first and third memory cells in the 2×2 matrix of the group are connected to a positive word line actuated during the in-memory compute operation in response to positive feature data; and
- second and fourth memory cells in the 2×2 matrix of the group are connected to a negative word line actuated during the in-memory compute operation in response to negative feature data.

21. The method of claim 20, wherein a computational weight of −1 is represented by a matrix $$\begin{bmatrix} 0 & 1 \\ 1 & 0 \end{bmatrix},$$

a computational weight of 0 is represented by a matrix $$\begin{bmatrix} 0 & 0 \\ 0 & 0 \end{bmatrix},$$

and a computational weight of +1 is represented by a matrix $$\begin{bmatrix} 1 & 0 \\ 0 & 1 \end{bmatrix}.$$

22. The method of claim 15, wherein the IMC operation is performed by an in-memory computation circuit including a memory array including a plurality of memory cells arranged in a matrix with plural rows and plural columns, wherein groups of memory cells store computational weights for the IMC operation;
- wherein memory cells in each column of the memory array are connected by a bit line;
- the method comprising:
  - generating the first analog signal on each bit line during the first MAC elaboration of the in-memory compute operation; and
  - generating the second analog signal on each bit line during the second MAC elaboration of the in-memory compute operation.

23. The method of claim 22, wherein each group of memory cells storing a computational weight comprises two memory cells arranged in a 1×2 matrix, and wherein:
- first and second memory cells in the 1×2 matrix of the group are connected to the bit line;
- the first memory cell in the 1×2 matrix of the group is connected to a positive word line actuated during the in-memory compute operation in response to positive feature data; and
- the second memory cell in the 1×2 matrix of the group is connected to a negative word line actuated during the in-memory compute operation in response to negative feature data.

24. The method of claim 23, wherein a computational weight of −1 is represented by a matrix $$\begin{bmatrix} 0 \\ 1 \end{bmatrix},$$

a computational weight of 0 is represented by a matrix $$\begin{bmatrix} 0 \\ 0 \end{bmatrix},$$

and a computational a matrix weight of +1 which is represented by a matrix $$\begin{bmatrix} 1 \\ 0 \end{bmatrix}.$$

25. The method claim 1, wherein integrating comprises converting a current provided by each of the first and second analog signals into a number of charge packets indicated by pulses, and wherein incrementing comprises counting the pulses in a ripple counter.

26. The method of claim 25, wherein converting the count value comprises:
- switching clock inputs of flip-flops forming the ripple counter from a ripple counter connection;
- applying an inverting pulse signal to the clock inputs of the flip-flops to cause a logical inversion of each bit of the count value stored by the flip-flops during a logic inversion portion of a 2's complement operation for converting the count value in the counter circuit to the negated count value; and
- applying a single pulse to an input of the ripple counter during an add one portion of the 2's complement operation for converting the count value in the counter circuit to the negated count value.

* * * * *